US012701907B2

(12) United States Patent
Shin et al.

(10) Patent No.: US 12,701,907 B2
(45) Date of Patent: Aug. 4, 2026

(54) PHOTOELECTRIC CONVERSION DEVICE AND DISPLAY DEVICE COMPRISING THE SAME

(71) Applicant: SAMSUNG DISPLAY CO., LTD., Yongin-si (KR)

(72) Inventors: Jun Yong Shin, Yongin-si (KR); Soung Wook Kim, Yongin-si (KR); Hwa Sook Ryu, Yongin-si (KR); Dong Kyu Seo, Yongin-si (KR); Seok Gyu Yoon, Yongin-si (KR); Dae Ho Lee, Yongin-si (KR); Hye Jin Jung, Yongin-si (KR); Young Eun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 279 days.

(21) Appl. No.: 18/513,781

(22) Filed: Nov. 20, 2023

(65) Prior Publication Data

US 2024/0341162 A1 Oct. 10, 2024

(30) Foreign Application Priority Data

Apr. 3, 2023 (KR) ........................ 10-2023-0043301

(51) Int. Cl.
*H10K 65/00* (2023.01)
*H10K 30/20* (2023.01)
(Continued)

(52) U.S. Cl.
CPC ............. *H10K 65/00* (2023.02); *H10K 30/20* (2023.02); *H10K 59/40* (2023.02);
(Continued)

(58) Field of Classification Search
CPC ......... H10K 65/00; H10K 59/40; H10K 30/20
(Continued)

(56) References Cited

U.S. PATENT DOCUMENTS 12,096,659 B2 9/2024 Kamada et al.
2022/0384536 A1 * 12/2022 Kimura .................. H10K 59/60
(Continued)

FOREIGN PATENT DOCUMENTS

KR 10-1074799 10/2011
KR 10-2016-0078208 7/2016
(Continued)

*Primary Examiner* — Xia L Cross
(74) *Attorney, Agent, or Firm* — F. CHAU & ASSOCIATES, LLC

(57) ABSTRACT

Embodiments of a display device include a plurality of light emitting portions including a plurality of light emitting elements; and a sensing portion including a photoelectric conversion device, wherein the photoelectric conversion device includes a first electrode, common electrode facing the first electrode, and a hole injection layer, hole transport layer, resonance layer, and an active layer stacked between the first electrode and the common electrode, and wherein the light emitting elements include, a pixel electrode, the common electrode facing the pixel electrode, and the hole injection layer, hole transport layer, resonance layer, and a light emitting layer stacked between the pixel electrode and the common electrode, wherein a thickness of each of the resonance layers of light emitting elements are different from each other, and a thickness of the resonance layer of a light emitting element is the same as a thickness of the resonance layer.

9 Claims, 9 Drawing Sheets

(51) Int. Cl.
*H10K 59/40* (2023.01)
*G06V 40/13* (2022.01)
*H10K 85/60* (2023.01)

(52) U.S. Cl.
CPC ........ *G06V 40/1318* (2022.01); *H10K 85/621* (2023.02); *H10K 85/657* (2023.02); *H10K 85/6572* (2023.02); *H10K 85/6576* (2023.02)

(58) Field of Classification Search
USPC .............................................................. 257/40
See application file for complete search history.

(56) References Cited

U.S. PATENT DOCUMENTS

| | | | | |
|---|---|---|---|---|
| 2023/0083099 | A1* | 3/2023 | Xu | H10K 59/8051<br>257/79 |
| 2024/0164175 | A1* | 5/2024 | Yamazaki | H10K 71/231 |
| 2024/0397755 | A1 | 11/2024 | Kamada et al. | |

FOREIGN PATENT DOCUMENTS

| | | |
|---|---|---|
| KR | 10-2020-0080484 | 7/2020 |
| KR | 10-2022-0129146 | 9/2022 |
| WO | WO2020053692 A1 | 3/2020 |

* cited by examiner

175: 175R, 175G, 175B
OAL: OAL1, OAL2, OAL3, OAL4

PHOTOELECTRIC CONVERSION DEVICE AND DISPLAY DEVICE COMPRISING THE SAME

CROSS-REFERENCE TO RELATED APPLICATION

This application claims priority from Korean Patent Application No. 10-2023-0043301 filed on Apr. 3, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a photoelectric conversion device and a display device comprising the same.

2. Description of the Related Art

As the information society continues to develop, the demand for display devices for displaying images has increased and diversified. Many electronic devices, such as smartphones, digital cameras, laptop computers, tablet personal computers (PCs), navigation devices, and smart televisions, utilize display devices to present information and communicate with users. In addition, portable devices, such as smartphones and tablet PCs, can provide users with various functions, such as image capturing, fingerprint recognition, and face recognition, through the display device.

Furthermore, developments in the optical and semiconductor industries, have allowed display devices to incorporate functionality for obtaining biometric information, such as skin moisture and blood pressure, and component information of fruits and vegetables using an oscillometric method that uses photosensors. However, oscillometric component measurement devices using photosensors can involve independent light sources, sensors, and display devices, and users may separately carry portable smartphones, tablet PCs, or the like, for running an application program, which can be inconvenient. Accordingly, recently, methods for integrating a component measuring device using photosensors and a portable display device with each other have been considered.

SUMMARY

Aspects of the present disclosure provide embodiments of a photoelectric conversion device capable of detecting an optical signal of a red wavelength band using a display panel and extracting various component information, including biometric information using the detected optical signal, and a display device comprising the same.

Aspects of the present disclosure are not restricted to those set forth herein, where other aspects of the present disclosure will become more apparent to one of ordinary skill in the art to which the present disclosure pertains by referencing the detailed description of the present disclosure given below.

According to an aspect of the present disclosure, a display device comprises a plurality of light emitting portions, wherein the plurality of light emitting portions include a plurality of light emitting elements; and a sensing portion including a photoelectric conversion device in the sensing portion, wherein the photoelectric conversion device includes a first electrode, a common electrode facing the first electrode, and a hole injection layer, a hole transport layer, a resonance layer having a thickness, and an active layer sequentially stacked between the first electrode and the common electrode, and wherein the plurality of light emitting elements include, a pixel electrode, the common electrode facing the pixel electrode, and the hole injection layer, the hole transport layer, the resonance layer, and a light emitting layer sequentially stacked between the pixel electrode and the common electrode, wherein a thickness of each of the resonance layers of light emitting elements configured to emit light of different colors are different from each other, and a thickness of the resonance layer of at least one of the light emitting elements is the same as a thickness of the resonance layer of the photoelectric conversion device.

In an embodiment, the light emitting elements include a first light emitting element configured to emit red light, a second light emitting element configured to emit green light, and a third light emitting element configured to emit blue light, and the resonance layer includes a first resonance layer having a first thickness disposed in the first light emitting element, a second resonance layer having a second thickness disposed in the second light emitting element, a third resonance layer having a third thickness disposed in the third light emitting element, and a fourth resonance layer having a fourth thickness disposed in the photoelectric conversion device.

In an embodiment, the first thickness is the same as the fourth thickness.

In an embodiment, the first thickness is greater than the second thickness and the third thickness.

In an embodiment, a distance from an upper surface of the pixel electrode of the first light emitting element to a lower surface of the light emitting layer is the same as a distance from an upper surface of the first electrode of the photoelectric conversion device to a lower surface of the active layer.

In an embodiment, the plurality of light emitting elements further include buffer layers, electron transport layers, and electron injection layers sequentially stacked on the light emitting layers, and the photoelectric conversion device further includes the buffer layer, the electron transport layer, and the electron injection layer sequentially stacked on the active layer.

In an embodiment, the active layer includes a donor layer and an acceptor layer disposed on the donor layer, and the donor layer is disposed on the resonance layer.

In an embodiment, the donor layer has a thickness of about 100 to about 200 Å.

In an embodiment, the acceptor layer has a thickness of about 300 to about 500 Å.

According to an aspect of the present disclosure, a plurality of light emitting portions on a substrate, wherein the plurality of light emitting portions include a plurality of light emitting elements; and a sensing portion on the substrate, wherein the sensing portion includes a photoelectric conversion device in the sensing portion, wherein the photoelectric conversion device includes an active layer including a donor layer and an acceptor layer, wherein the donor layer includes a compound represented by Formula 1:

[Formula 1]

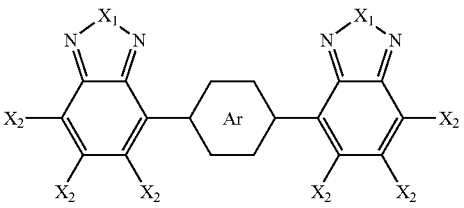

wherein Ar is selected from the group consisting of a substituted or unsubstituted $C_4$ to $C_{30}$ carbocyclic ring, a heterocyclic ring, or condensed rings thereof, wherein the carbocyclic ring and the heterocyclic ring are each monosubstituted or polysubstituted with a first substituent selected from the group consisting of a halogen, a cyano group, a $C_1$ to $C_{10}$ alkyl group, an alkoxy group, an aryl group, and an aryloxy group, and each $X_1$ is a second substituent selected from the group consisting of N, O, S or Se, and each $X_2$ is a third substituent selected from the group consisting of hydrogen, halogen, or a cyano group.

In an embodiment, the compound represented by Formula 1 is one of the following compounds:

D01

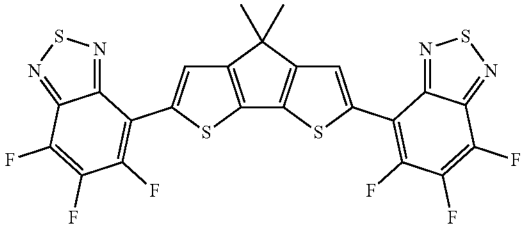

D02

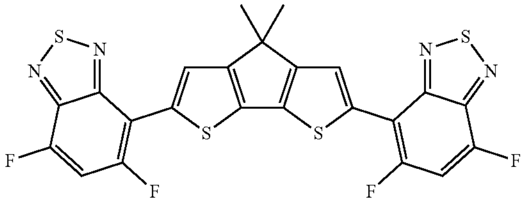

D03

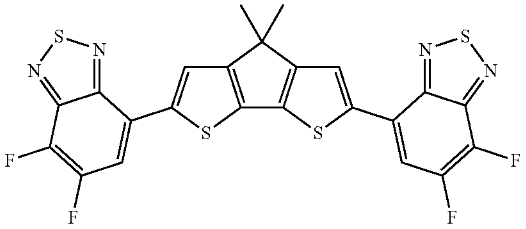

D04

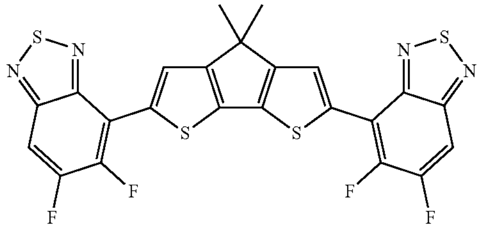

-continued

D05

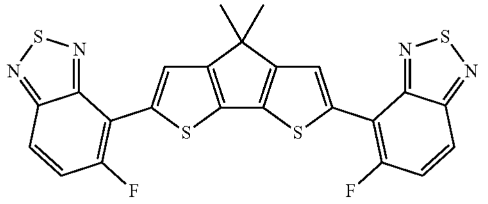

D06

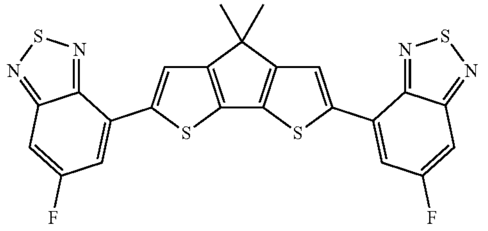

D07

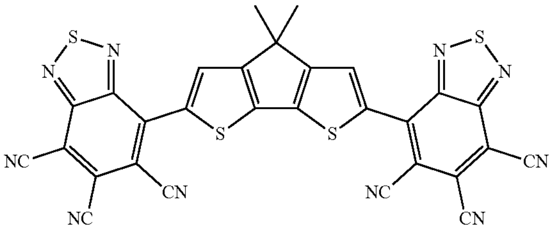

D08

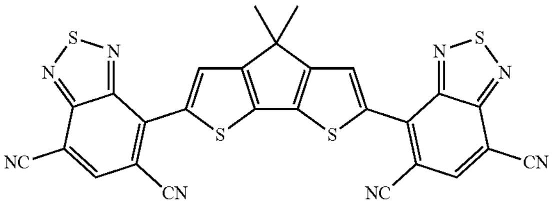

D09

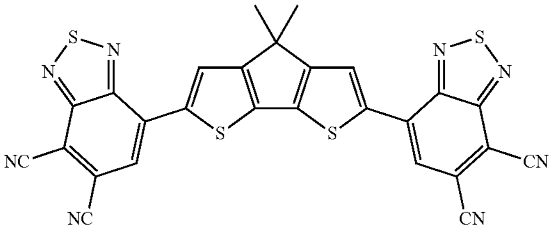

D10

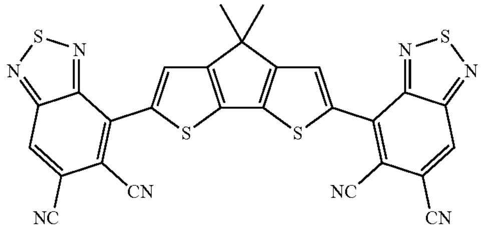

D11

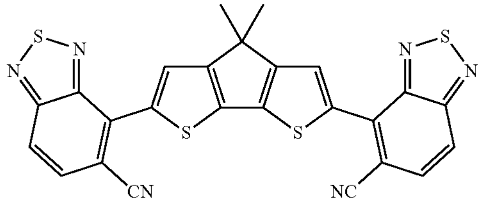

D12
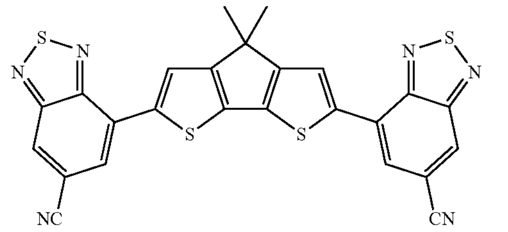
D13
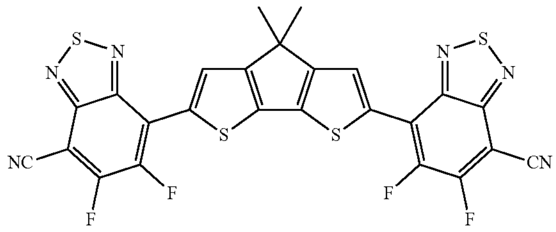
D14
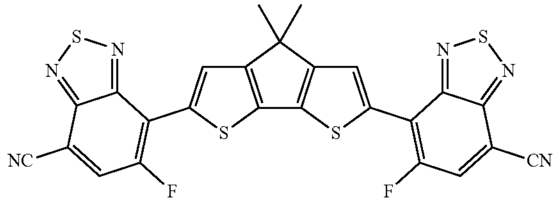
D15
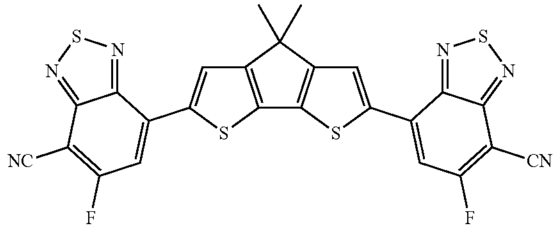
D16
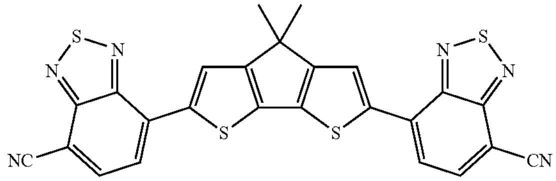
D17
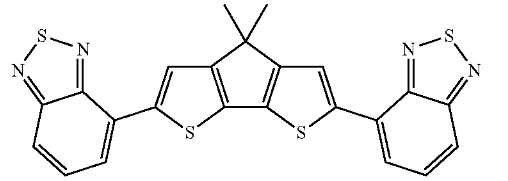
D18
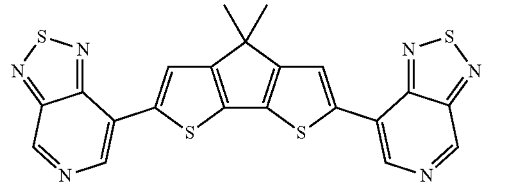
D19
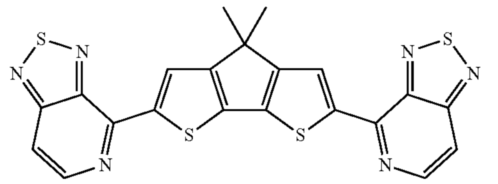
D20
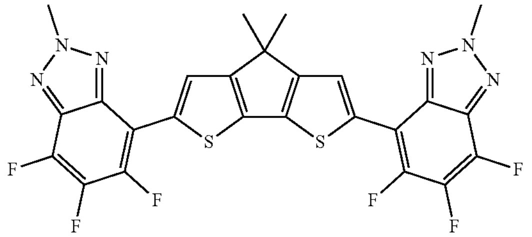
D21
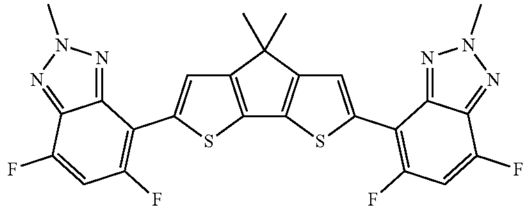
D22
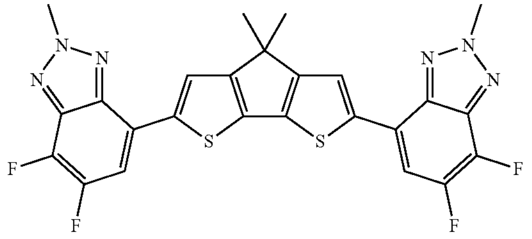
D23
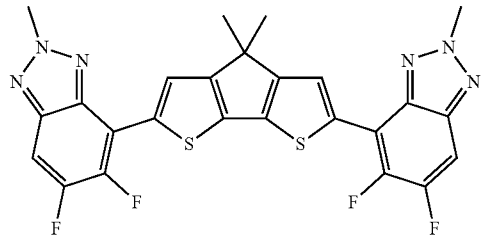
D24
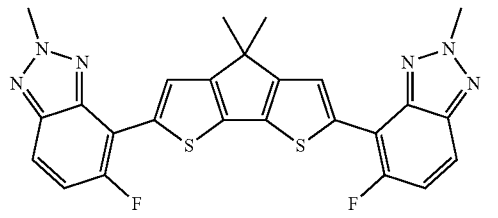

-continued
D25
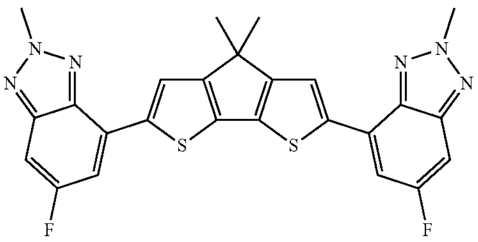
D26
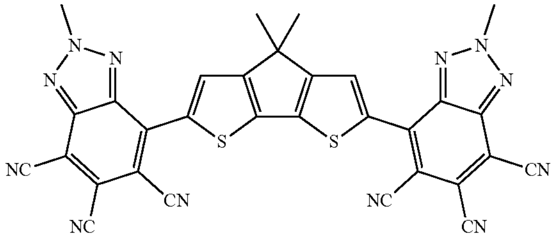
D27
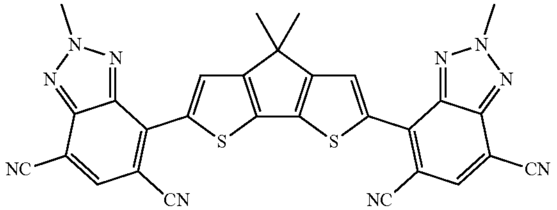
D28
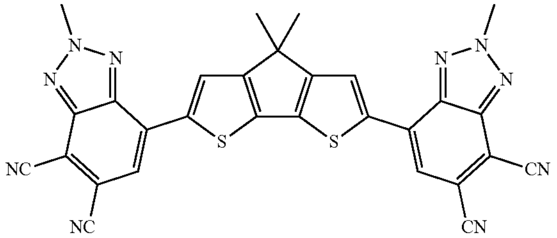
D29
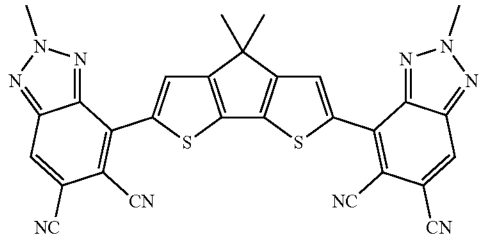
D30
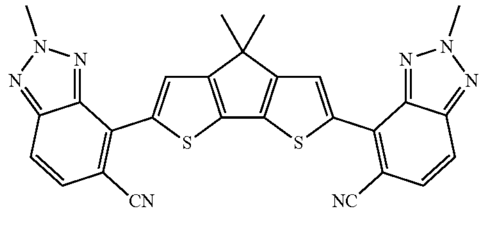
-continued
D31
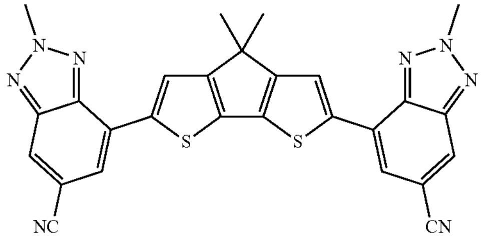
D32
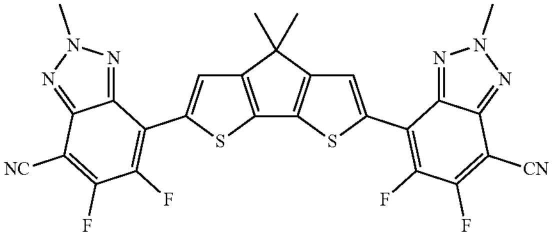
D33
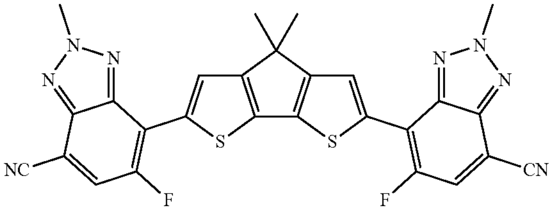
D34
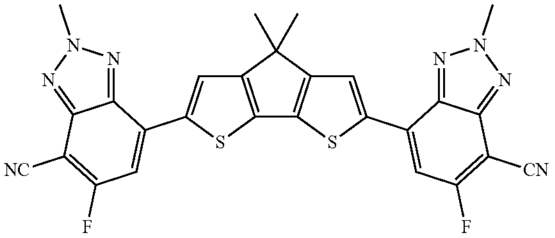
D35
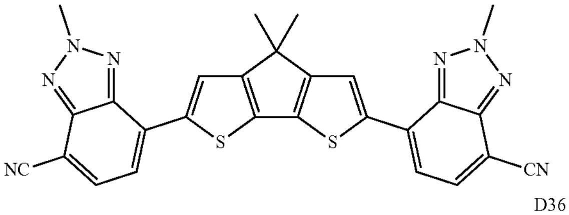
D36
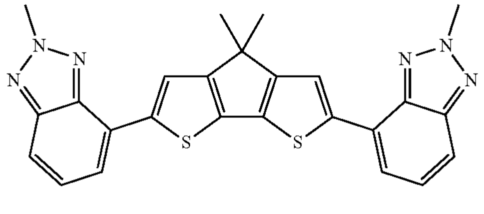
D37
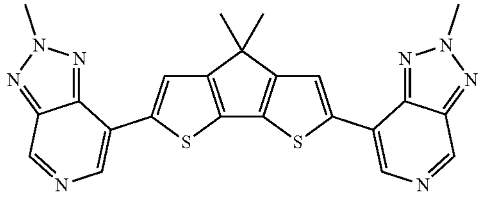

D38
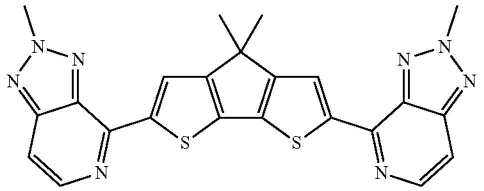
D39
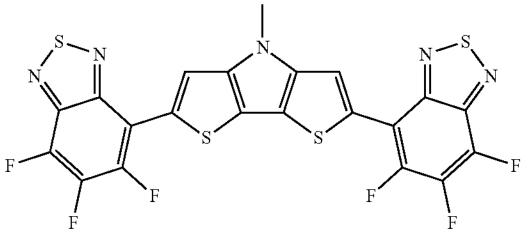
D40
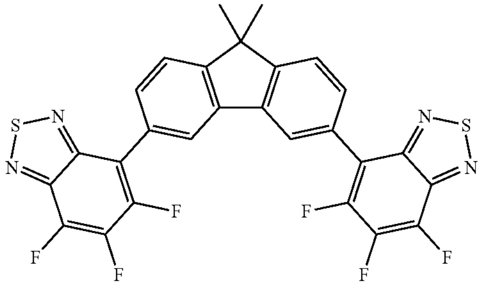
D41
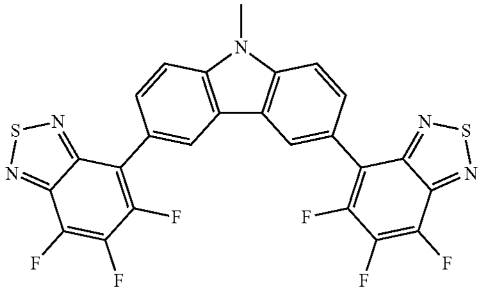
D42
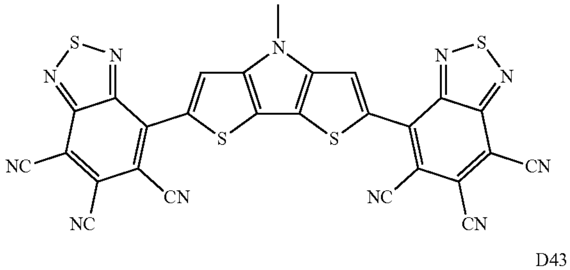
D43
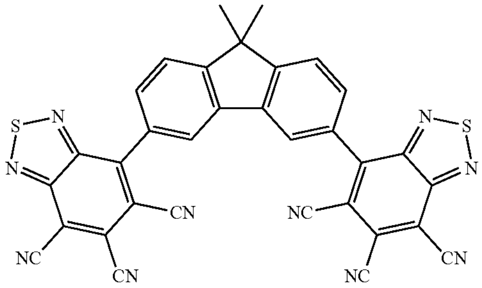
D44
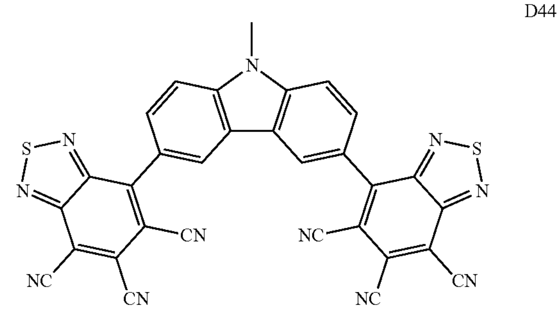
D45
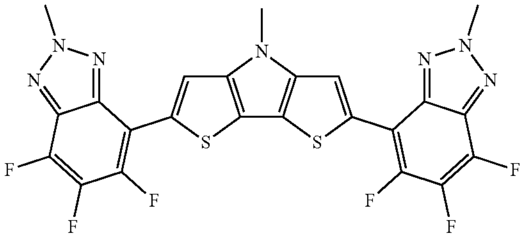
D46
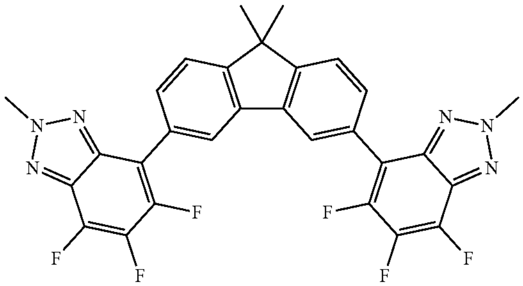
D47
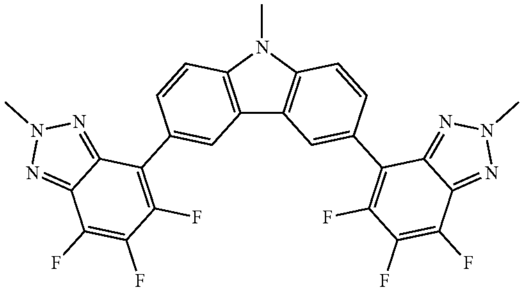
D48
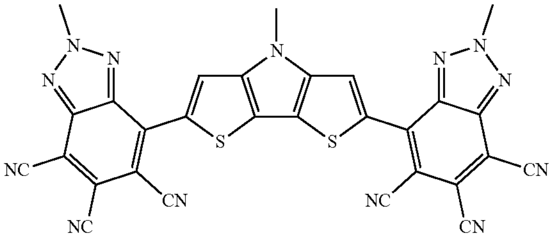

-continued

D49

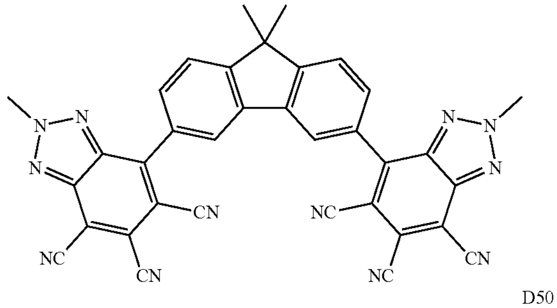

D50

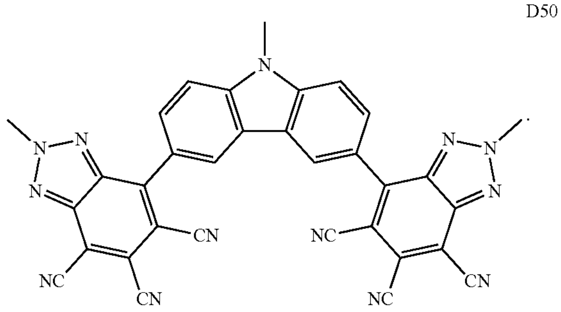

In an embodiment, the acceptor layer includes a compound represented by Formula 2:

[Formula 2]

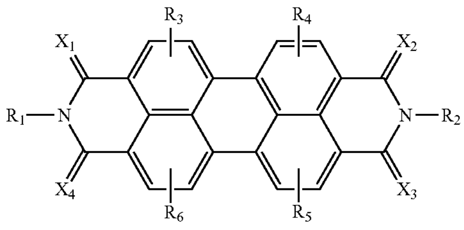

wherein $R_1$ and $R_2$ are each independently selected from the group consisting of a $C_3$ to $C_{10}$ cycloalkyl substituted or unsubstituted, a $C_3$ to $C_{10}$ heterocycloalkyl substituted or unsubstituted, a $C_3$ to $C_{10}$ cycloalkenyl substituted or unsubstituted, and a $C_3$ to $C_{10}$ heterocycloalkenyl substituted or unsubstituted with a substituent of hydrogen, deuterium, halogen, nitrogen, oxygen, boron, silicon, sulfur, sulfur dioxide, phosphorus, or phosphorus oxide, $R_3$, $R_4$, $R_5$, and $R_6$ are each independently selected from the group consisting of a $C_1$ to $C_{10}$ cycloalkyl substituted or unsubstituted, a $C_3$ to $C_{10}$ heterocycloalkyl substituted or unsubstituted, a $C_3$ to $C_{10}$ cycloalkenyl substituted or unsubstituted, a $C_3$ to $C_{10}$ heterocycloalkenyl substituted or unsubstituted, a $C_6$ to $C_{60}$ aryl substituted or unsubstituted, a $C_2$ to $C_{60}$ heteroaryl substituted or unsubstituted, a non-aromatic condensed polycyclic group substituted or unsubstituted, and a non-aromatic heterocondensed polycyclic group substituted or unsubstituted with a substituent of hydrogen, deuterium, halogen, nitrogen, oxygen, boron, silicon, sulfur, sulfur dioxide, phosphorus, or phosphorus oxide, and $X_1$, $X_2$, $X_3$, and $X_4$ are each independently an oxygen atom or a substituted carbon atom.

In an embodiment, the compound represented by Formula 2 is one of the following compounds:

A01

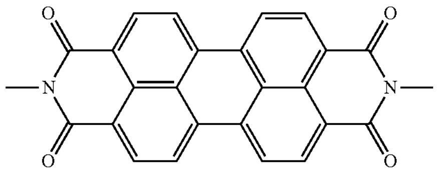

A02

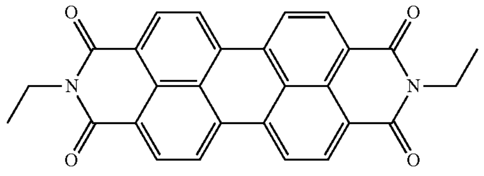

A03

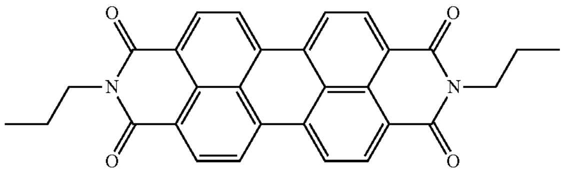

A04

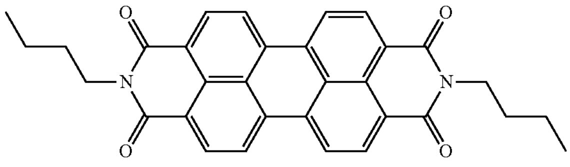

A05

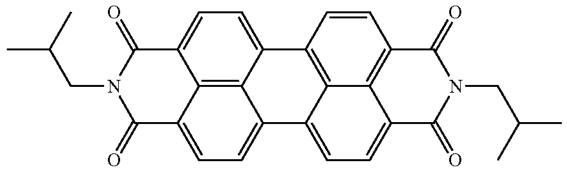

A06

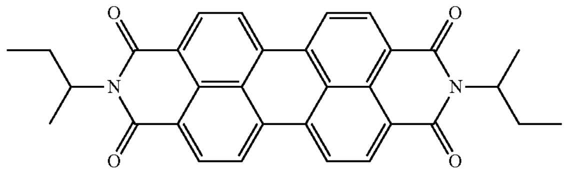

A07

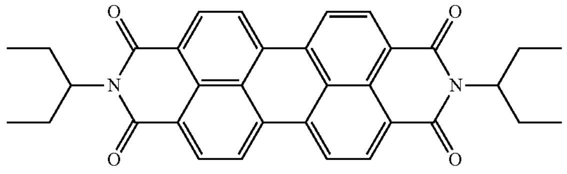

A08

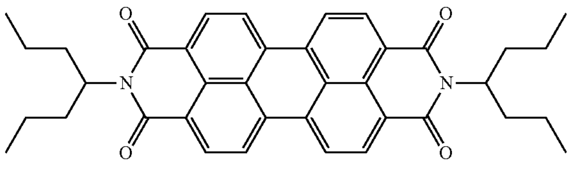

-continued
A9
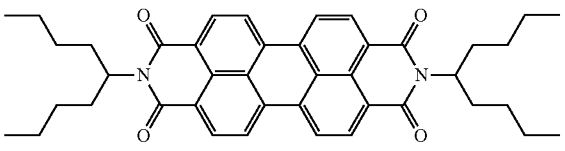
A10
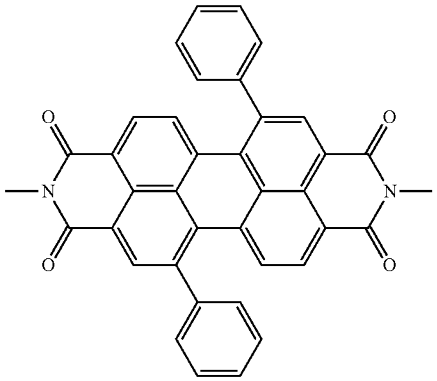
A11
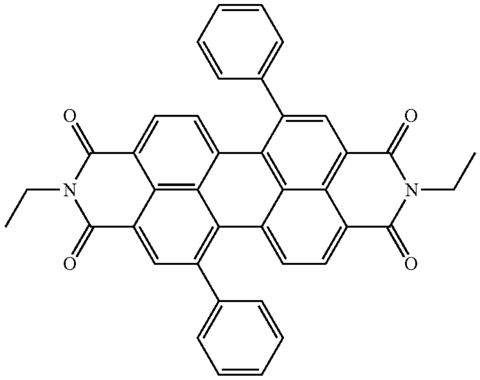
A12
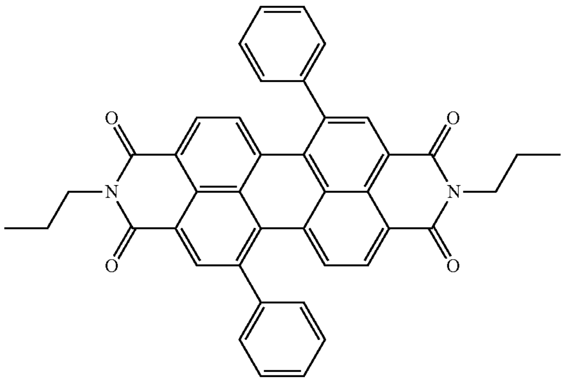
-continued
A13
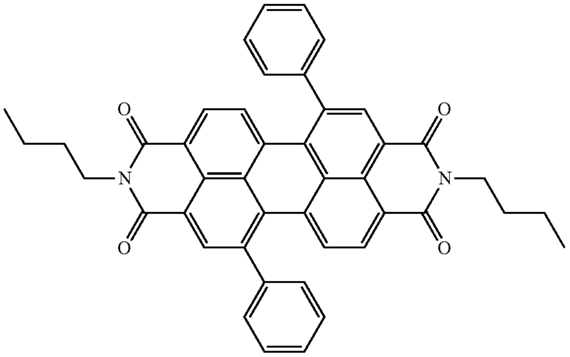
A14
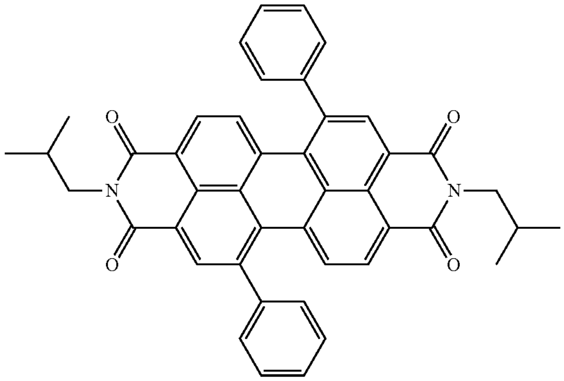
A15
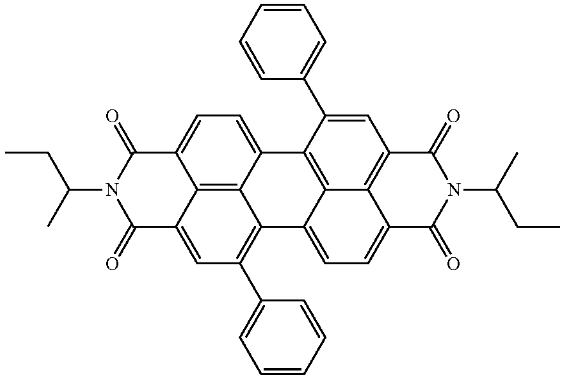
A16
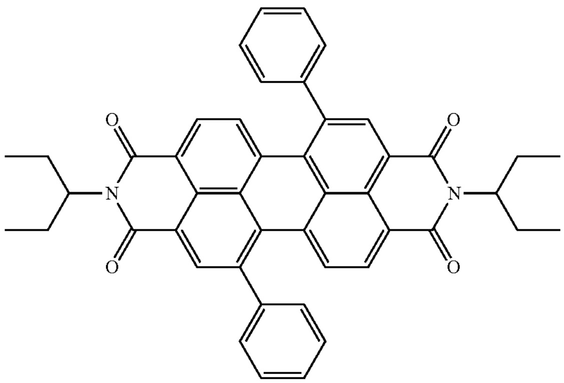

-continued

A17

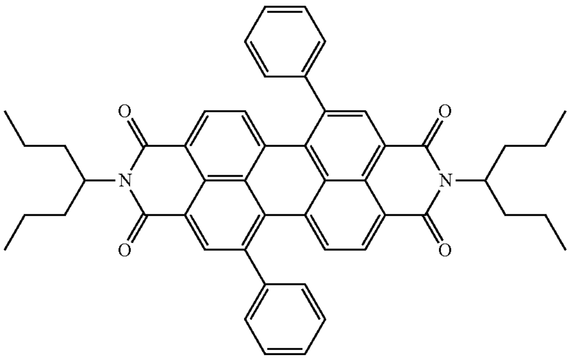

A18

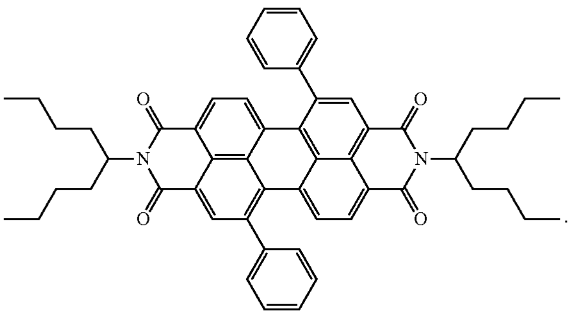

In an embodiment, the donor layer has a thickness of about 100 to about 200 Å.

In an embodiment, the acceptor layer has a thickness of about 300 to about 500 Å.

According to an aspect of the present disclosure, a photoelectric conversion device comprises a substrate, a first electrode disposed on the substrate, an active layer disposed on the first electrode and including a donor layer and an acceptor layer, and a common electrode disposed on the active layer, wherein the donor layer includes a compound represented by Formula 1:

[Formula 1]

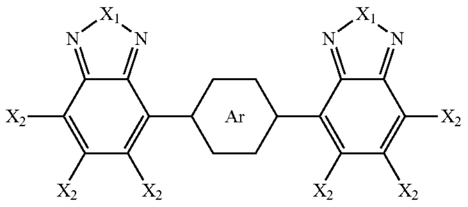

wherein Ar is independently any one selected from the group consisting of a substituted or unsubstituted $C_4$ to $C_{30}$ carbocyclic ring, heterocyclic ring, or condensed rings thereof, and the carbocyclic ring and the heterocyclic ring are each monosubstituted or polysubstituted with any one selected from the group consisting of halogen, a cyano group, a $C_1$ to $C_{10}$ alkyl group, an alkoxy group, an aryl group, or an aryloxy group, and each $X_1$ is any one selected from the group consisting of N, O, S or Se, and each $X_2$ is any one selected from the group consisting of hydrogen, halogen, or a cyano group.

In an embodiment, the compound represented by Formula 1 is one of the following compounds:

D01

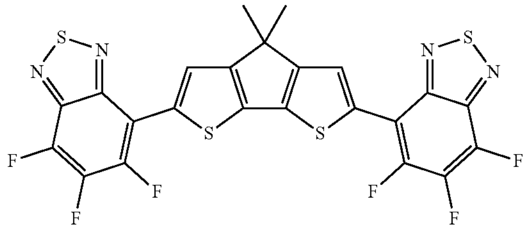

D02

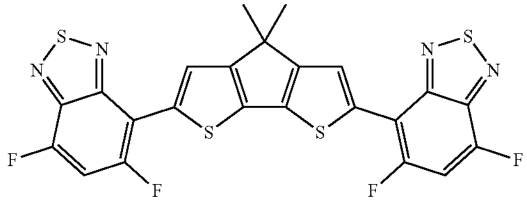

D03

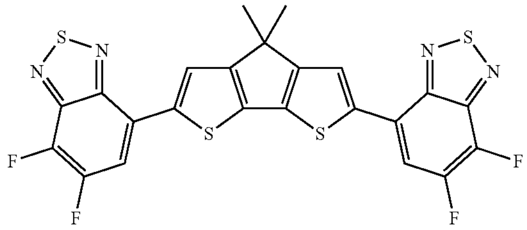

D04

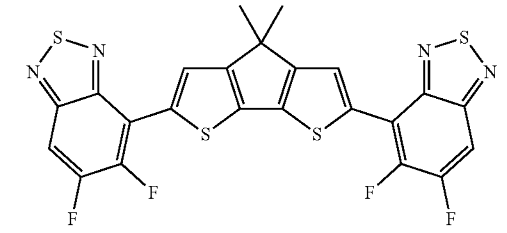

D05

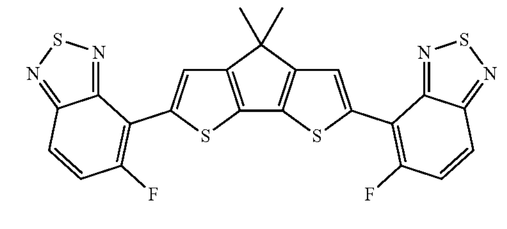

D06

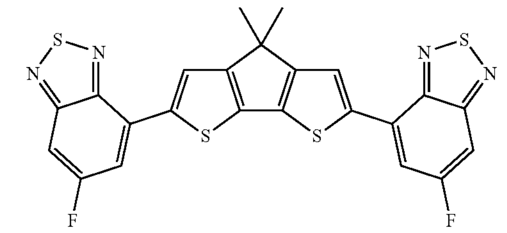

-continued
D07
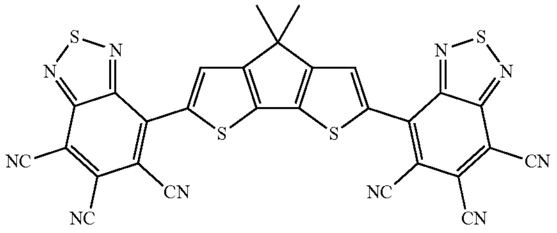
D08
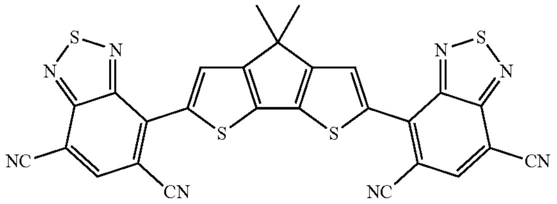
D09
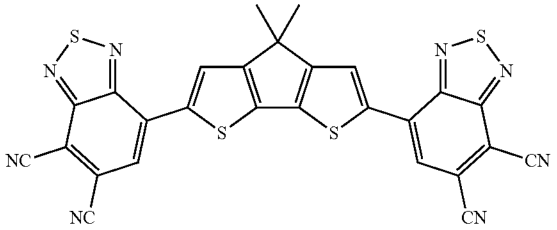
D10
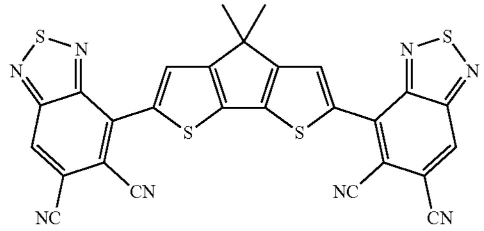
D11
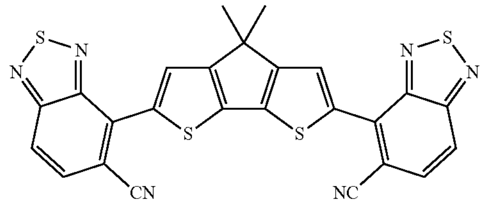
D12
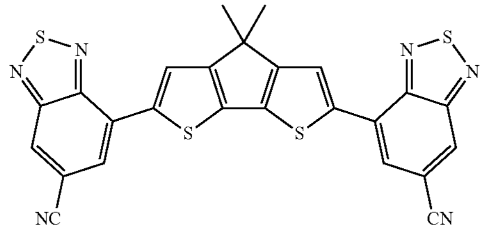
-continued
D13
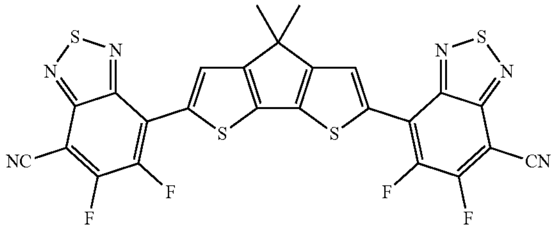
D14
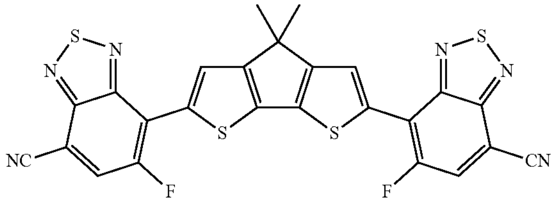
D15
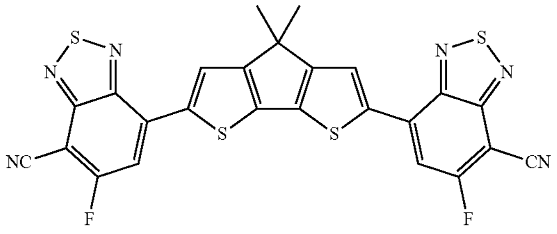
D16
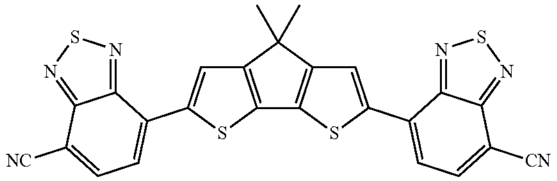
D17
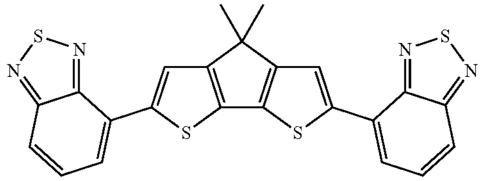
D18
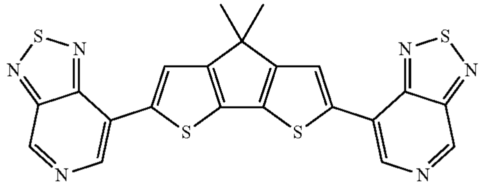
D19
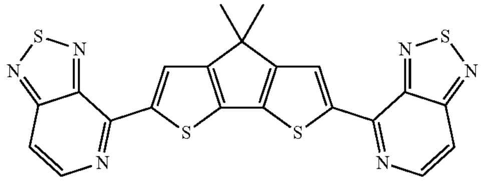

-continued
D20
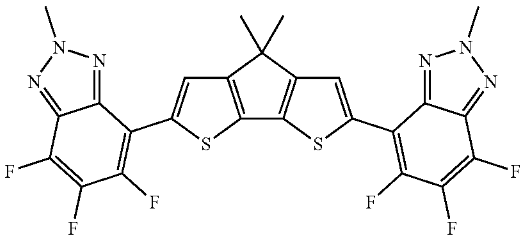
D21
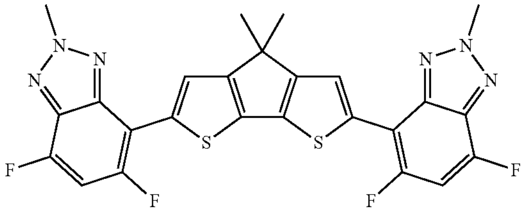
D22
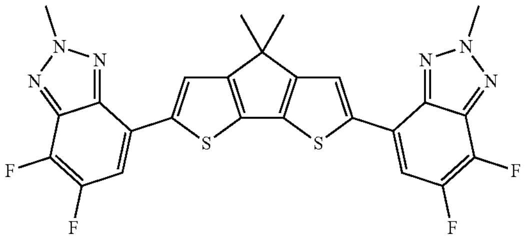
D23
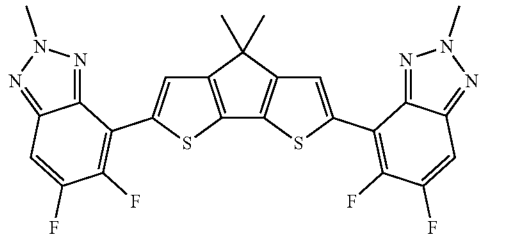
D24
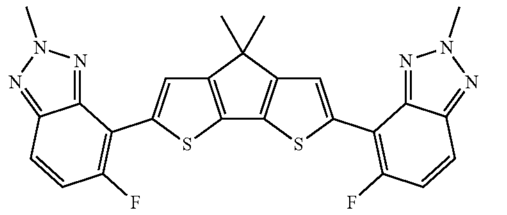
D25
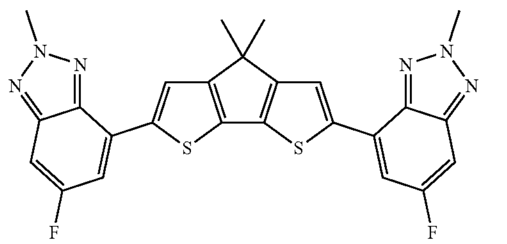
-continued
D26
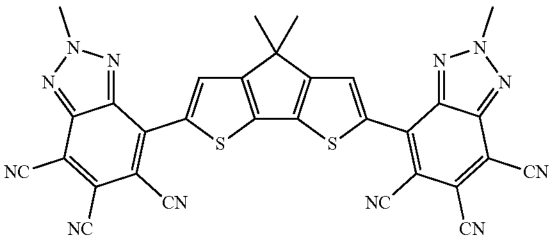
D27
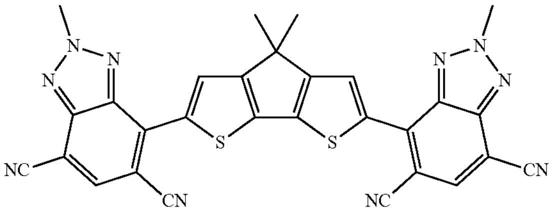
D28
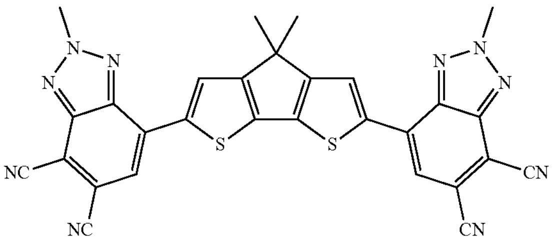
D29
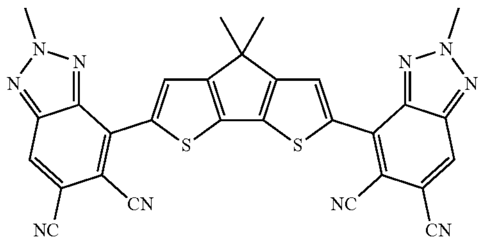
D30
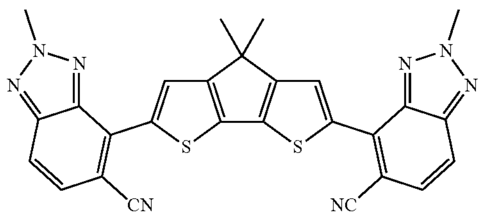
D31
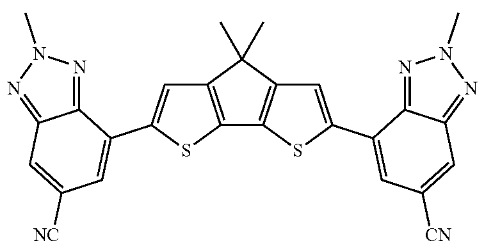

-continued
D32
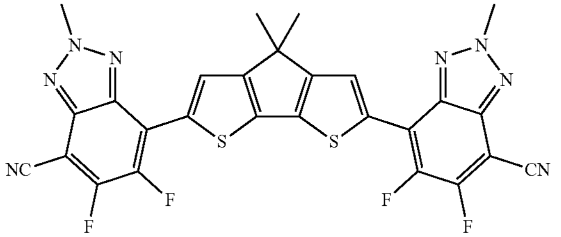
D33
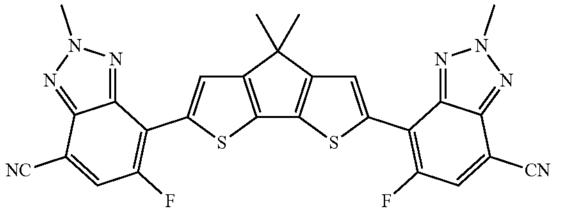
D34
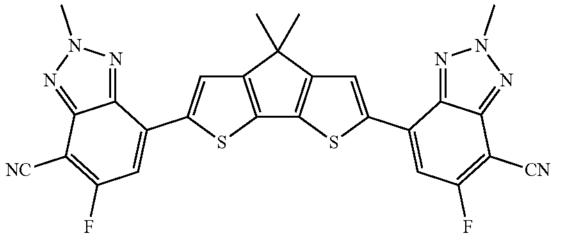
D35
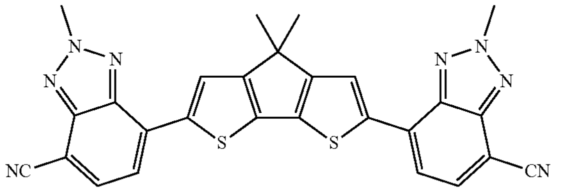
D36
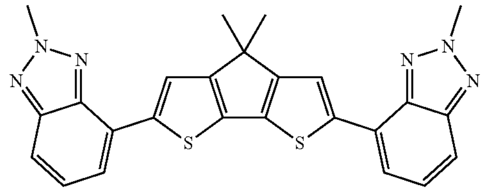
D37
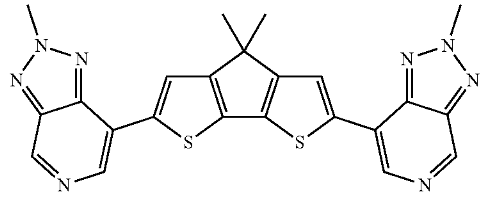
D38
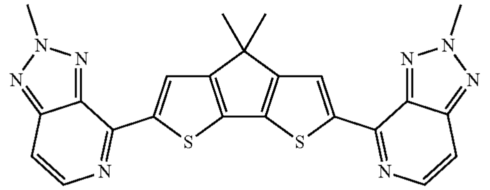
-continued
D39
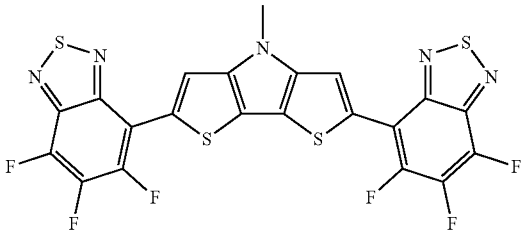
D40
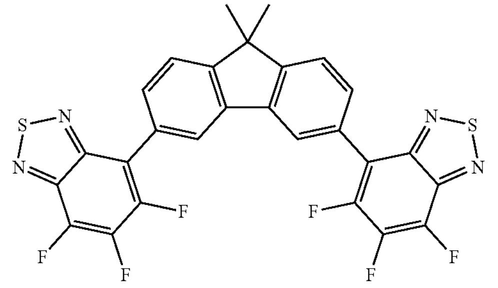
D41
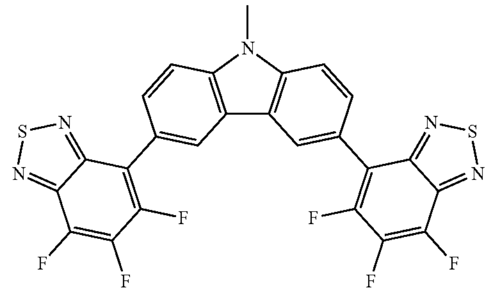
D42
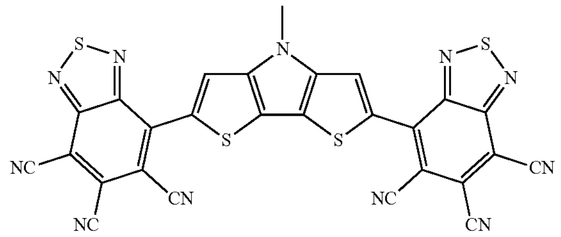
D43
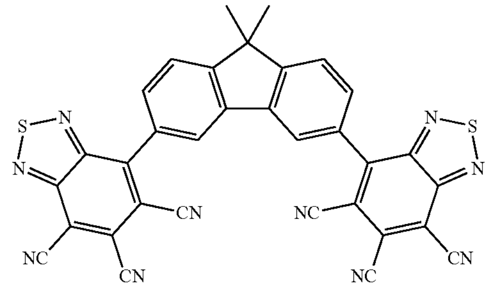

-continued

D44

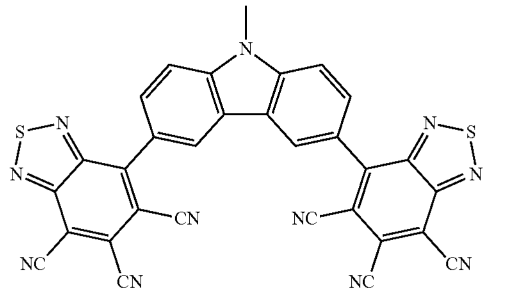

D45

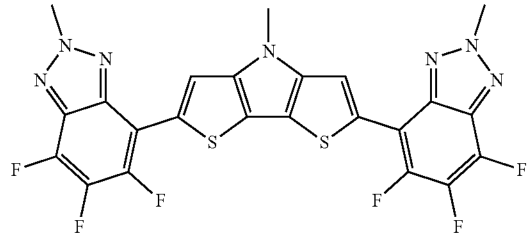

D46

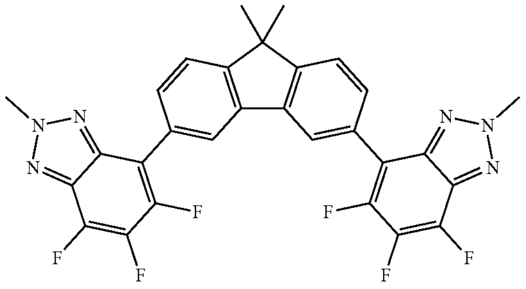

D47

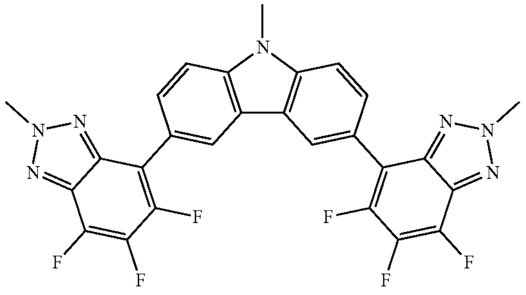

D48

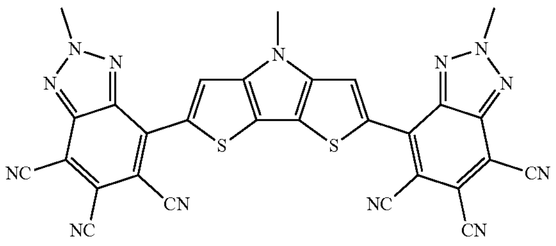

-continued

D49

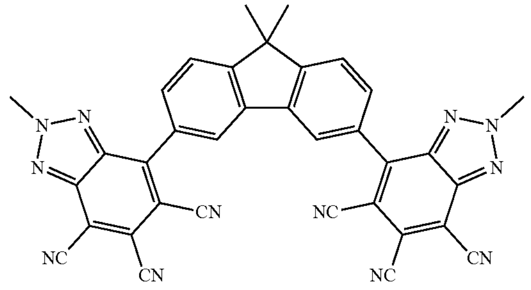

D50

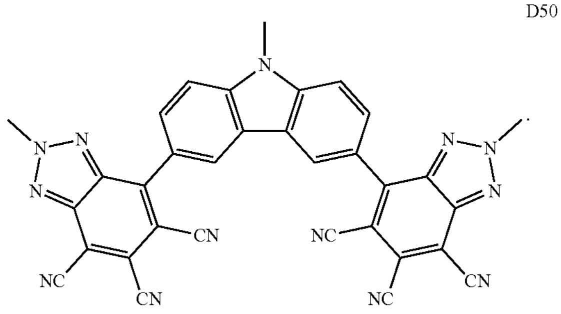

In an embodiment, the acceptor layer includes a compound represented by Formula 2:

[Formula 2]

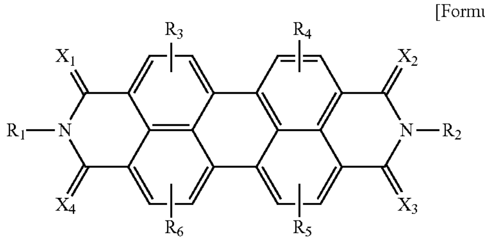

wherein $R_1$ and $R_2$ are each independently any one selected from the group consisting of $C_3$ to $C_{10}$ cycloalkyl substituted or unsubstituted, $C_3$ to $C_{10}$ heterocycloalkyl substituted or unsubstituted, $C_3$ to $C_{10}$ cycloalkenyl substituted or unsubstituted, and $C_3$ to $C_{10}$ heterocycloalkenyl substituted or unsubstituted with a substituent of hydrogen, deuterium, halogen, nitrogen, oxygen, boron, silicon, sulfur, sulfur dioxide, phosphorus, or phosphorus oxide, $R_3$, $R_4$, $R_5$, and $R_6$ are each independently any one selected from the group consisting of $C_1$ to $C_{10}$ or $C_3$ to $C_{10}$ cycloalkyl substituted or unsubstituted, $C_3$ to $C_{10}$ heterocycloalkyl substituted or unsubstituted, $C_3$ to $C_{10}$ cycloalkenyl substituted or unsubstituted, $C_3$ to $C_{10}$ heterocycloalkenyl substituted or unsubstituted, $C_6$ to $C_{60}$ aryl substituted or unsubstituted, $C_2$ to $C_{60}$ heteroaryl substituted or unsubstituted, a non-aromatic condensed polycyclic group substituted or unsubstituted, and a non-aromatic heterocondensed polycyclic group substituted or unsubstituted with a substituent of hydrogen, deuterium, halogen, nitrogen, oxygen, boron, silicon, sulfur, sulfur dioxide, phosphorus, or phosphorus oxide, and $X_1$, $X_2$, $X_3$, and $X_4$ are each independently an oxygen atom or a substituted carbon atom.

In an embodiment, the compound represented by Formula 2 is one of the following compounds:

A01
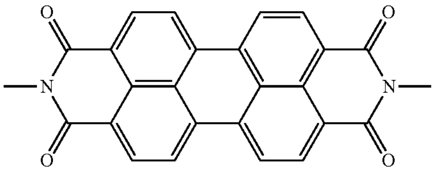
A02
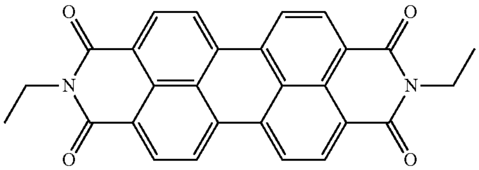
A03
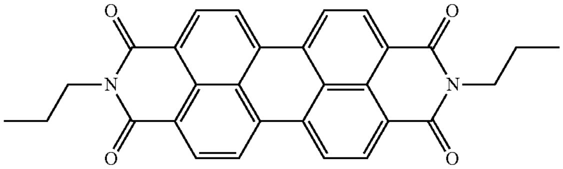
A04
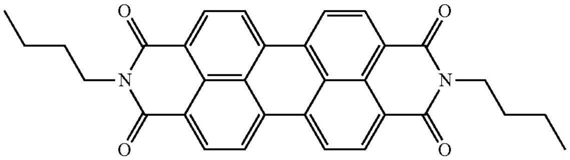
A05
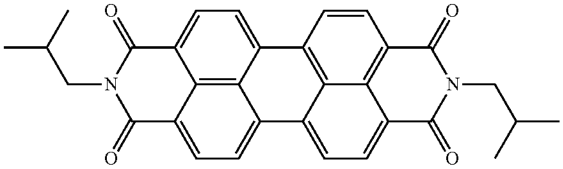
A06
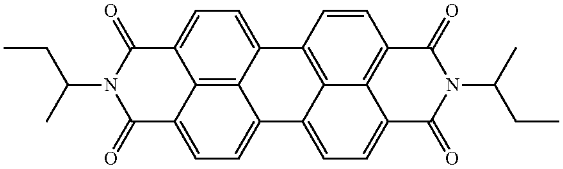
A07
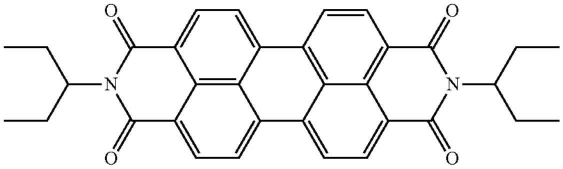
A08
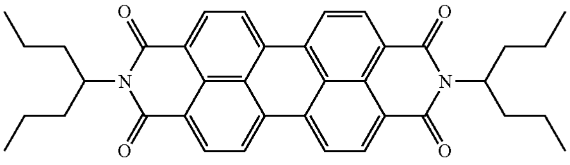
-continued
A9
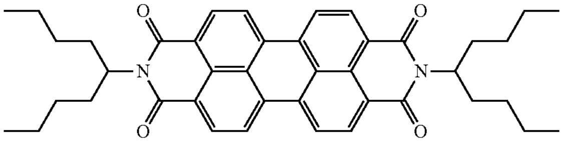
A10
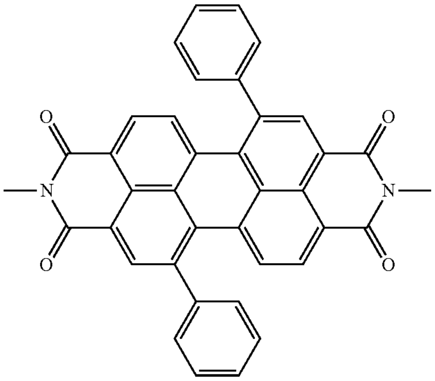
A11
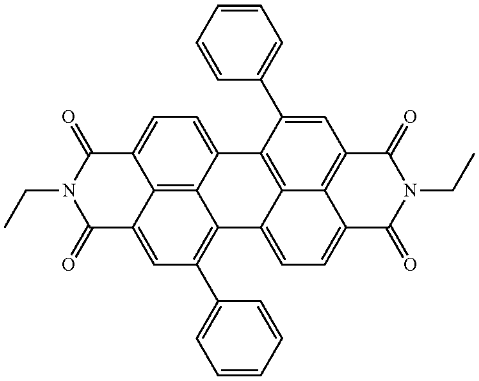
A12
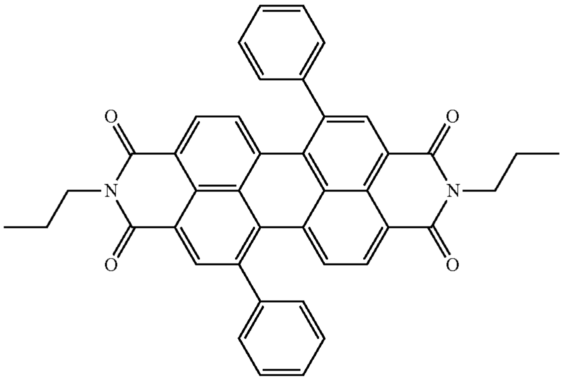

-continued

A13

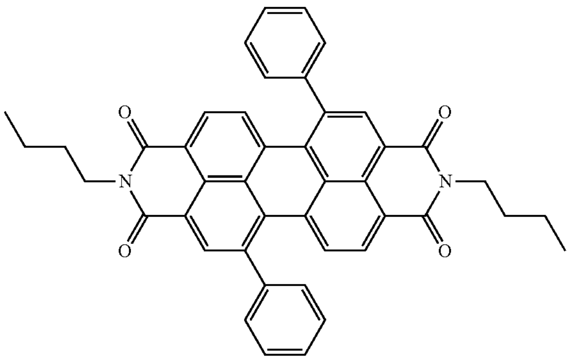

A14

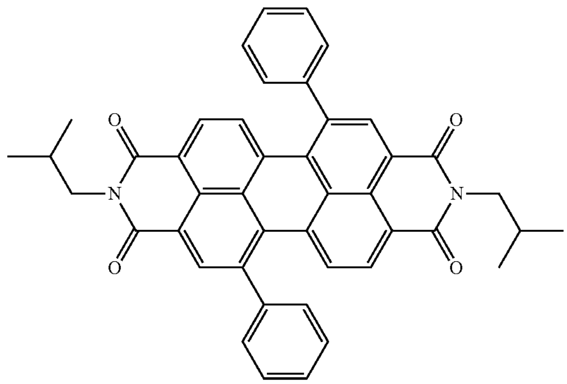

A15

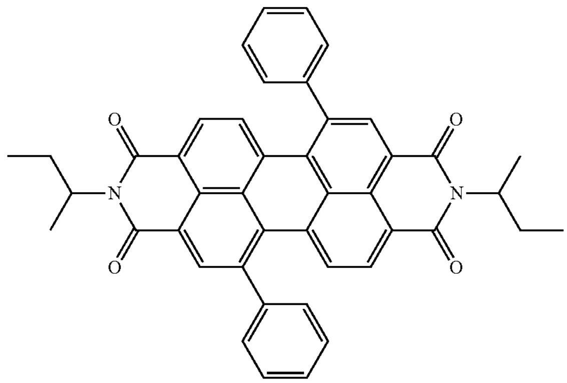

A16

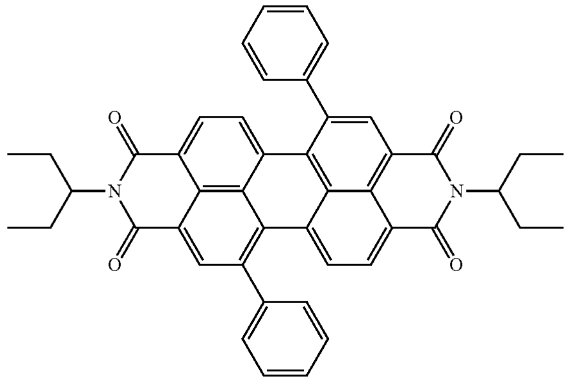

-continued

A17

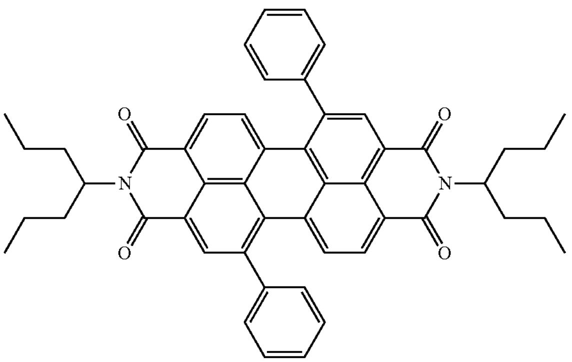

A18

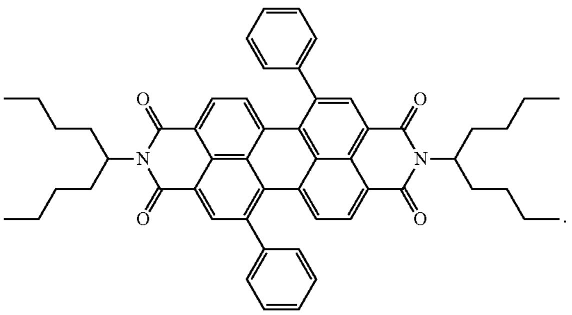

In an embodiment, the donor layer has a thickness of about 100 to about 200 Å, and the acceptor layer has a thickness of about 300 to about 500 Å.

A photoelectric conversion device and a display device comprising the same according to an embodiment may improve sensing characteristics of red light by including a donor layer including a compound represented by Formula 1 and an acceptor layer including a compound represented by Formula 2.

In addition, since a first light emitting element from which the red light is emitted and the photoelectric conversion device on which the red light is incident and sensed have the same resonance distance, efficiency of the red light may be increased to improve luminous efficiency and light sensing efficiency.

In addition, various biometric information such as a user's fingerprint and blood pressure may be extracted using the red light.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Principles and embodiments of the present invention will now be described more fully hereinafter with reference to the accompanying drawings. The various embodiments of the invention described herein may have different forms from those described and should not be construed as limited to the various embodiments set forth herein.

It will also be understood that when a layer is referred to as being "on" another layer or substrate, it can be directly on the other layer or substrate, or intervening layers may also be present, whereas "directly on" refers to two layers being in physical contact without an intervening layer.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It should also be understood that each of the features of the various embodiments of the present disclosure may be combined with each other, in part or in whole. Each embodiment may be implemented independently of each other or may be implemented together in an association.

Hereinafter, embodiments will be described with reference to the accompanying drawings, where the same reference numbers indicate the same components throughout the specification.

Figure 1:
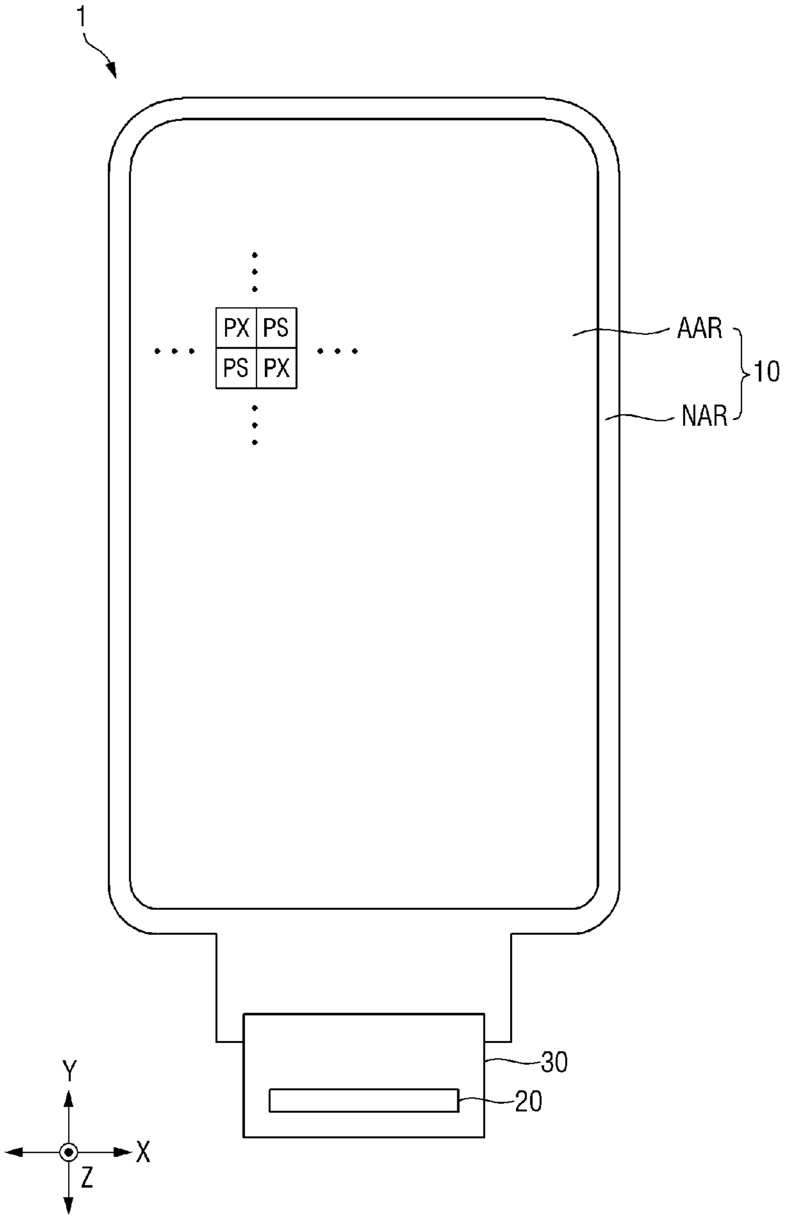
FIG. 1 is a plan view of a display device, according to an embodiment of the inventive concept.

FIG. 1 is a plan view of a display device according to an embodiment.

In FIG. 1, a first direction X, a second direction Y, and a third direction Z are indicated. The first direction X is a direction parallel to one side of a display device 1 in plan view, and may be, for example, a transverse direction of the display device 1. The second direction Y is a direction parallel to the other side of the display device 1 in contact with one side of the display device 1 in plan view, and may be a longitudinal direction of the display device 1. Hereinafter, for convenience of explanation, one side in the first direction X refers to a right direction in plan view, the other side in the first direction X refers to a left direction in plan view, one side in the second direction Y refers to an upper direction in plan view, and the other side in the second direction Y refers to a lower direction in plan view. The third direction Z may be a thickness direction of the display device 1. However, it is to be understood that directions mentioned in embodiments refer to relative directions, and embodiments are not limited to the mentioned directions.

Unless otherwise defined, the terms "above" and "upper surface" expressed with respect to the third direction Z, as used herein, refer to a display surface side with respect to a display panel 10, and the terms "below" and "lower surface", and "rear surface" expressed with respect to the third direction Z, as used herein, refer to a side opposite to a display surface with respect to the display panel 10.

Referring to FIG. 1, the display device 1 may include various electronic devices providing a display screen, where the display screen may be incorporated into the display device 1. Examples of the display device 1 may include, but are not limited to, mobile phones, smartphones, tablet personal computers (PCs), mobile communication terminals, electronic notebooks, electronic books, personal digital assistants (PDAs), portable multimedia players (PMPs), navigation devices, ultra mobile PCs (UMPCs), televisions, game machines, wrist watch-type electronic devices, head-mounted displays, monitors of personal computers, laptop computers, vehicle instrument boards, digital cameras, camcorders, external billboards, electric signs, various medical devices, various inspection devices, various home appliances including display areas, such as refrigerators and washing machines, Internet of Things (IoT) devices, or the like. Representative examples of a display device 1 to be described later may include smartphones, tablet PCs, laptop computers, or the like, but are not limited thereto.

The display device 1 may include a display panel 10, a panel driver 20, and a circuit board 30.

The display panel 10 may include an active area AAR and a non-active area NAR.

The active area AAR may include a display area in which an image can be displayed, where the active area AAR may completely overlap the display area. A plurality of pixels PX displaying an image may be disposed in the display area. Each pixel PX may include a light emitting portion EMA (see FIG. 5) configured for emitting light.

In various embodiments, the active area AAR may further include a light sensing area, where the light sensing area is an area configured for responding to light, and may be an area configured to sense an amount, a wavelength, or the like, of incident light. The light sensing area may overlap the display area, where the light sensing area and the display area may be co-extensive. In an embodiment, the light sensing area may completely overlap the active area AAR in a plan view. In this case, the light sensing area and the display area may be the same as each other. In another embodiment, the light sensing area may be disposed only in a portion of the active area AAR, where for example, the light sensing area may be disposed only in a limited area configured for blood pressure or fingerprint recognition. The light sensing area may overlap a portion of the display area, but may not overlap another portion of the display area.

In various embodiments, a plurality of photosensors PS responding to light may be disposed in the light sensing area. Each photosensor PS may include a light sensing portion RA (see FIG. 5) sensing incident light.

The non-active area NAR may be disposed around the active area AAR, where the non-active area NAR may surround the active area AAR. A panel driver 20 may be disposed in the non-active area NAR, where the panel driver 20 may be formed as an integrated circuit (IC), and may be mounted on the display panel 10 and/or the circuit board 30. The panel driver 20 may drive the plurality of pixels PX and/or the plurality of photosensors PS. The panel driver 20 may output signals and voltages for driving the display panel 10. Signal lines for transferring signals between the panel driver 20 and the active area AAR may be further disposed in the non-active area NAR.

In various embodiments, the circuit board 30 may be attached to one end of the display panel 10, where the circuit board 30 may be attached using an anisotropic conductive film (ACF). Lead lines of the circuit board 30 may be electrically connected to pad parts of the display panel 10. The circuit board 30 may be a flexible printed circuit board 30 or a flexible film such, as a chip on film.

Figure 2:
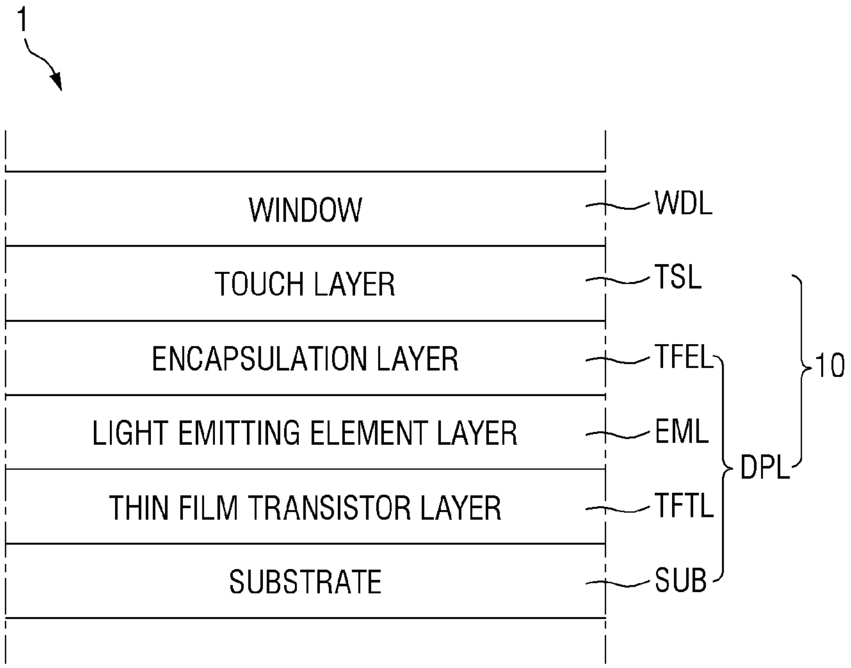
FIG. 2 is a schematic diagram of a cross-section of the display device, according to an embodiment of the inventive concept.

FIG. 2 is a schematic cross-sectional view of the display device according to an embodiment.

Referring to FIG. 2, the display device 1 may include a window WDL, and a display panel 10 having a display layer DPL and a touch sensing layer TSL, where the display layer DPL and the touch sensing layer TSL may constitute the display panel 10. The display layer DPL may include a substrate SUB, a thin film transistor layer TFTL disposed on the substrate SUB, a light emitting element layer EML, and an encapsulation layer TFEL. The touch sensing layer TSL may be on the encapsulation layer TFEL, and the window WDL may be on the touch sensing layer TSL.

In various embodiments, the substrate SUB may be a rigid substrate or be a flexible substrate that can be bent, folded, and rolled. The substrate SUB may be made of an insulating material, such as glass, quartz, or a polymer resin. Examples of the polymer resin may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), or combinations thereof.

In various embodiments, the thin film transistor layer TFTL disposed on the substrate SUB may include a plurality of thin film transistors driving pixels and a plurality of display signal lines. The plurality of display signal lines may include scan lines configured for transferring scan signals to the respective pixels and data lines configured for transferring data signals to the respective pixels.

In various embodiments, the light emitting element layer EML disposed on a surface of the thin film transistor layer TFTL may include light emitting elements EL (see FIG. 6) configured for emitting light and photoelectric conversion devices PD (see FIG. 6) configured for detecting light, where impinging light may generate an electrical signal.

Each of the light emitting elements EL may emit light with a predetermined luminance according to an anode voltage and a cathode voltage applied from the thin film transistor layer TFTL. Each of the light emitting elements EL may emit light with a predetermined wavelength.

In various embodiments, each of the light emitting elements EL may be an organic light emitting diode including an anode electrode, a cathode electrode, and an organic light emitting layer disposed between the anode electrode and the cathode electrode. Alternatively, each of the light emitting elements may be an inorganic light emitting element including an anode electrode, a cathode electrode, and an inorganic semiconductor disposed between the anode electrode and the cathode electrode. Alternatively, each of the light emitting elements may be a quantum dot light emitting element including an anode electrode, a cathode electrode, and a quantum dot light emitting layer disposed between the anode electrode and the cathode electrode. Alternatively, each of the light emitting elements may be a micro light emitting diode.

In various embodiments, each of the photoelectric conversion devices PD may generate photocharges in proportion to incident light. The accumulated photocharges may be converted into electrical signals involved in sensing the impinging light according to the anode voltage and the cathode voltage applied from the thin film transistor layer TFTL.

Each of the photoelectric conversion devices PD may include an anode electrode, a cathode electrode, and an active layer disposed between the anode electrode and the cathode electrode. Each of the photoelectric conversion devices PD may convert light incident from outside of the display device 1 into an electrical signal. The photoelectric conversion device PD may be a light receiving diode or a phototransistor made of a pn-type or pin-type inorganic material. Alternatively, the photoelectric conversion device PD may be an organic light receiving diode using an organic material. A detailed description of the light emitting element EL and the photoelectric conversion device PD described above will be provided later.

In various embodiments, the encapsulation layer TFEL may be disposed on the light emitting element layer EML, where the encapsulation layer TFEL may be directly on the light emitting element layer EML. The encapsulation layer TFEL may include a stacked arrangement of inorganic films and/or organic films in order to prevent moisture or oxygen from penetrating into the light emitting elements of the light emitting element layer EML, where the arrangement of inorganic films and/or organic films can form a stacked film.

In various embodiments, the touch sensing layer TSL may be disposed on the encapsulation layer TFEL, where the touch sensing layer TSL may be directly on the encapsulation layer TFEL. The touch sensing layer TSL may include a plurality of touch electrodes for sensing a user's touch and a plurality of signal lines. The touch sensing layer TSL may sense the user's touch as a self-capacitance type or a mutual capacitance type.

The window WDL may be disposed on the touch sensing layer TSL, where the window WDL may be directly on the touch sensing layer TSL. The window WDL may include a rigid, transparent material such as glass or quartz. The window WDL may include, for example, a window member. The window WDL may be attached onto the touch sensing layer TSL using an optical transparent adhesive or the like.

In various embodiments, a polarizing film for decreasing external light reflection may be additionally disposed between the touch sensing layer TSL and the window WDL.

Figure 3:
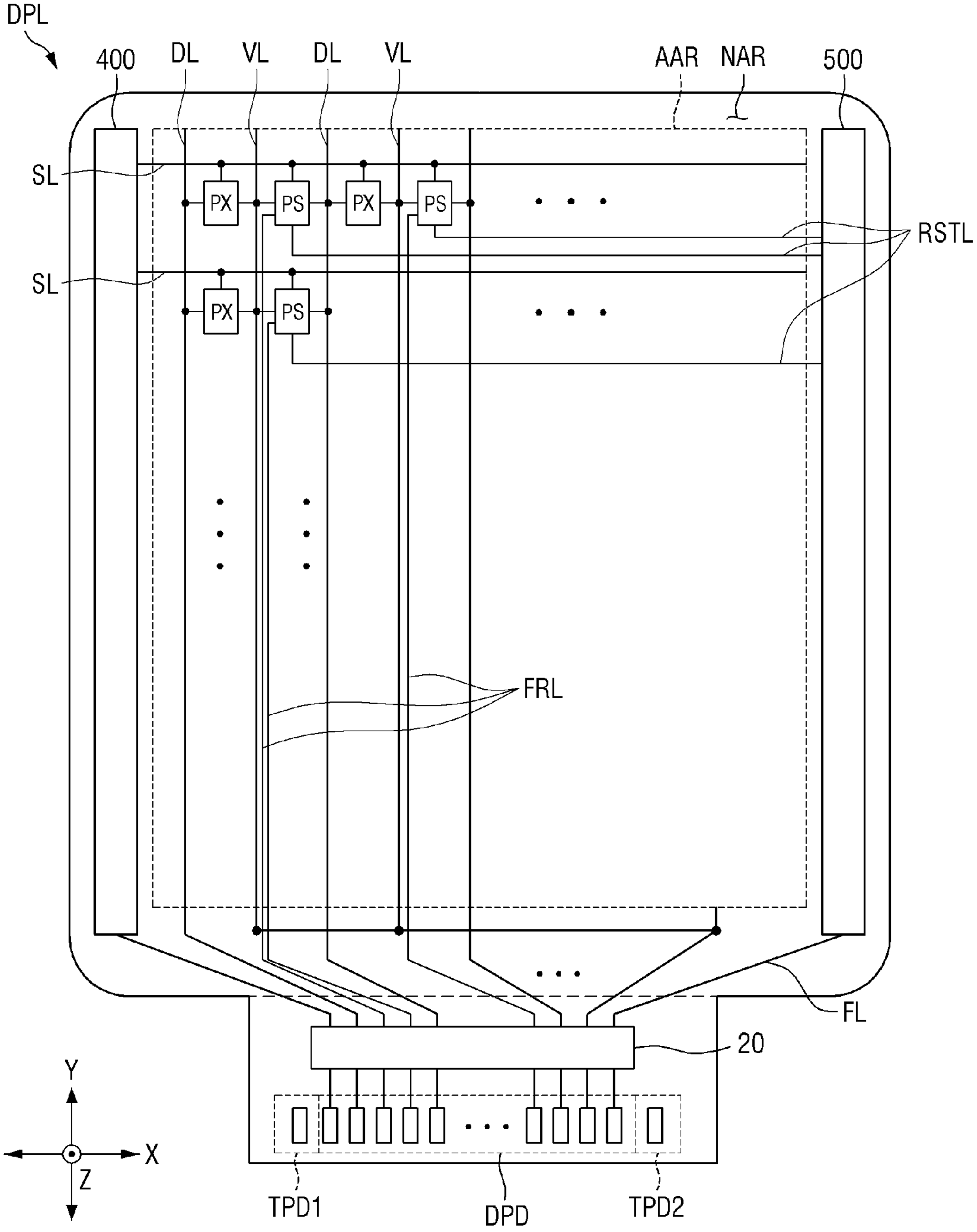
FIG. 3 is a schematic plan layout view of a display layer, according to an embodiment of the inventive concept.

FIG. 3 is a schematic plan layout view of a display layer, according to an embodiment.

Referring to FIG. 3, scan lines SL and source voltage lines VL connected to the plurality of pixels PX and the plurality of photosensors PS, data lines DL connected to the plurality of pixels PX, and reset lines RSTL and sensing lines FRL connected to the plurality of photosensors PS may be disposed in the active area AAR of the display layer DPL. The can lines SL may be oriented in a first direction, and source voltage lines VL may be oriented in a second direction crossing the first direction.

In various embodiments, the scan lines SL may supply scan signals received from a scan driver 400 to the plurality of pixels PX and the plurality of photosensors PS. The scan lines SL may extend in the first direction X and may be spaced apart from each other in the second direction Y. The scan driver 400 may be in the region of the non-active area NAR.

In various embodiments, the data lines DL may supply data voltages received from the panel driver 20 to the plurality of pixels PX. The data lines DL may extend in the second direction Y and may be spaced apart from each other in the first direction X.

In various embodiments, the source voltage lines VL may supply a source voltage received from the panel driver 20 to the plurality of pixels PX and the plurality of photosensors PS. Here, the source voltage may be at least one of a first source voltage ELVDD, a second source voltage ELVSS, or an initialization voltage. The source voltage lines VL may extend in the second direction Y and may be spaced apart from each other in the first direction X in the active area AAR, and may be connected to each other in the non-active area NAR.

In various embodiments, the reset lines RSTL may supply reset signals received from a reset signal generator 500 to the plurality of photosensors PS. The reset lines RSTL may extend in the first direction X and may be spaced apart from each other in the second direction Y. The reset signal generator 500 may be in the region of the non-active area NAR.

In various embodiments, the sensing lines FRL may supply currents generated by photocharges of the photosensors PS to a fingerprint sensing portion. The sensing lines FRL may extend in the second direction Y and may be spaced apart from each other in the first direction X.

In various embodiments, the non-active area NAR of the display layer DPL may include the scan driver 400, fan-out lines FL, the reset signal generator 500, and the panel driver 20.

In various embodiments, the scan driver 400 may generate a plurality of scan signals based on a scan control signal, and may sequentially supply the plurality of scan signals to the plurality of scan lines SL according to a set order.

The fan-out lines FL may extend from the panel driver 20 across the non-active area NAR to the active area AAR. The fan-out lines FL may supply the data voltages received from the panel driver 20 to the plurality of data lines DL. In addition, the fan-out lines FL may transfer the currents received from the sensing lines FRL to the panel driver 20.

In various embodiments, the reset signal generator 500 may generate a plurality of reset signals based on a reset control signal, and may sequentially supply the reset signals to a plurality of reset lines RSTL according to a set order. The reset control signal may be received from the panel driver 20 over a fan-out line FL. The photosensors PS connected to the reset lines RSTL may receive the reset signals, where the reset signals may be transmitted from the reset signal generator 500. In various embodiments, the reset signal generator 500 may be omitted.

In various embodiments, the panel driver 20 may output signals and voltages to the fan-out lines FL for driving the display panel 10. The panel driver 20 may supply the data voltages to the data lines DL through the fan-out lines FL. The data voltages may be supplied to the plurality of pixels PX, and may determine luminance of the plurality of pixels PX.

In various embodiments, the panel driver 20 may include a signal sensing portion. The signal sensing portion may measure magnitudes of the currents of the photosensors PS communicated through the sensing lines FRL. The signal sensing portion may generate blood pressure sensing data or fingerprint sensing data according to the magnitudes of the currents sensed by the photosensors PS and transmit the blood pressure sensing data or fingerprint sensing data to a main processor. The main processor may measure blood pressure or determine whether or not a fingerprint coincides with a user's fingerprint through a comparison with a preset fingerprint by analyzing the blood pressure sensing data or fingerprint sensing data. As another example, the signal sensing portion may be formed as an integrated circuit separate from the panel driver 20.

In addition, the panel driver 20 may supply the scan control signal to the scan driver 400 through a scan control line.

In various embodiments, the non-active area NAR of the display layer DPL may further include a display pad part DPD and first and second touch pad parts TPD1 and TPD2. The display pad part DPD, the first touch pad part TPD1, and the second touch pad part TPD2 may be electrically connected to the circuit board 30 using a low-resistance high-reliability material such as an anisotropic conductive film or a self assembly anisotropic conductive paste (SAP). The display pad part DPD may include a plurality of display pads.

It has been described by way of example in the present embodiment that the respective scan lines SL are simultaneously connected to the plurality of pixels PX and the plurality of photosensors PS, but the present disclosure is not limited thereto, and types and arrangement forms of the signal lines may be various. In this case, the plurality of pixels PX and the plurality of photosensors PS may be turned on or turned off based on the same scan signal. Accordingly, a form of a fingerprint may be optically sensed during a period in which a screen is displayed.

Figure 4:
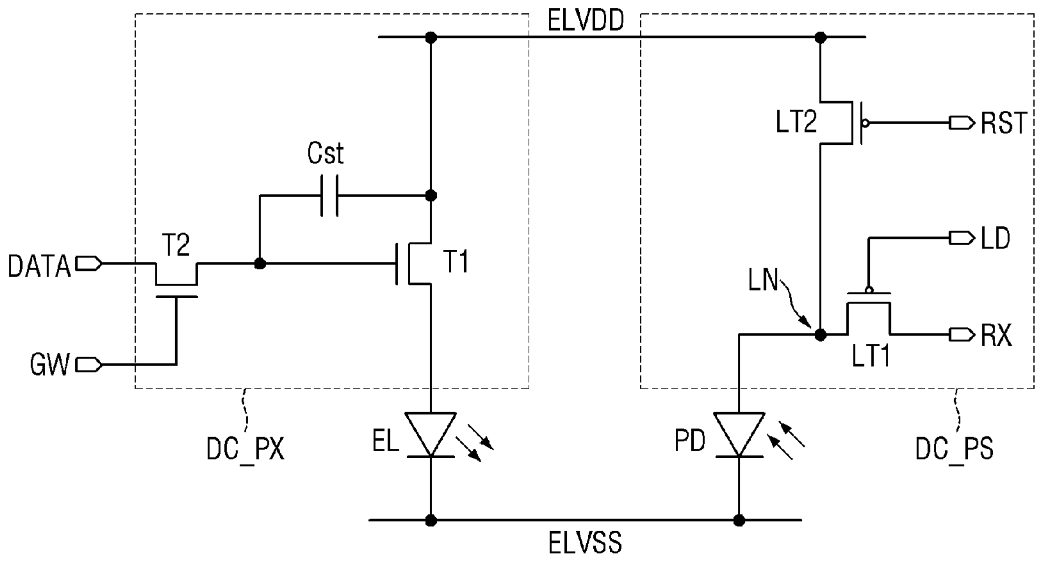
FIG. 4 is a circuit diagram illustrating a pixel and a photosensor of the display layer, according to an embodiment of the inventive concept.

FIG. 4 is a circuit diagram illustrating a pixel and a photosensor of the display layer, according to an embodiment.

Referring to FIG. 4, the display panel 10 may include a display driving circuit DC_PX controlling an amount of light emitted from the plurality of pixels PX and a sensing driving circuit DC_PS controlling an amount of light received by the plurality of photosensors PS. The display panel 10 may apply driving signals or driving voltages to one or more transistors included in the display driving circuit DC_PX and the sensing driving circuit DC_PS and various signal lines.

The display driving circuit DC_PX and the sensing driving circuit DC_PS may be each formed as an integrated circuit or may be integrated as one integrated circuit as illustrated in FIG. 4.

The display driving circuit DC_PX may include a light emitting element EL, a capacitor Cst, a first transistor T1, and a second transistor T2. The display driving circuit DC_PX may receive a data signal DATA, a first scan signal GW, a first source voltage ELVDD, and a second source voltage ELVSS. The data signal DATA may be provided through the panel driver 20 connected to the data line DL, and the first scan signal GW may be provided through the scan driver 400 connected to the scan line SL.

In various embodiments, the light emitting element EL is, for example, an organic light emitting diode including an anode electrode, a cathode electrode, and a light emitting layer 175 (see FIG. 6) disposed between the anode electrode and the cathode electrode. The anode electrode of the light emitting element EL may be connected to the first transistor T1. The cathode electrode of the light emitting element EL may be connected to a second source voltage ELVSS terminal to receive the second source voltage ELVSS. The anode electrode of the light emitting element EL may correspond to a pixel electrode 170 of FIG. 6, and the cathode electrode of the light emitting element EL may correspond to a common electrode 190 of FIG. 6.

The capacitor Cst is connected between a gate electrode of the first transistor T1 and a first source voltage ELVDD terminal. The capacitor Cst may include a capacitor first electrode connected to the gate electrode of the first transistor T1 and a capacitor second electrode connected to the first source voltage ELVDD terminal.

In various embodiments, the first transistor T1 may be a driving transistor, and the second transistor T2 may be a switching transistor. Each of the first and second transistors T1 and T2 may include a gate electrode, a source electrode, and a drain electrode. One of the source electrode and the drain electrode may be one electrode, and the other of the source electrode and the drain electrode may be the other electrode. Hereinafter, for convenience of explanation, a case where the drain electrode is one electrode and the source electrode is the other electrode will be described by way of example.

The first transistor T1 may be the driving transistor that generates a driving current. The gate electrode of the first transistor T1 can be connected to the capacitor first electrode, one electrode of the first transistor T1 can be connected to the first source voltage ELVDD terminal, and the other electrode of the first transistor T1 can be connected to the anode electrode of the light emitting element EL. The capacitor second electrode can be connected to one electrode of the first transistor T1.

Tin various embodiments, the second transistor T2 is the switching transistor, a gate electrode of the second transistor T2 is connected to a first scan signal GW terminal, one electrode of the second transistor T2 is connected to a data signal DATA terminal, and the other electrode of the second transistor T2 is connected to one electrode of the first transistor T1. The second transistor T2 may be turned on according to the first scan signal GW to perform a switching operation of transferring the data signal DATA to one electrode of the first transistor T1.

The capacitor Cst may be charged with a voltage corresponding to the data signal DATA received from the second transistor T2. The first transistor T1 may control the driving current flowing to the light emitting element EL according to a quantity of charges stored in the capacitor Cst.

However, this is a non-limiting example, and the display driving circuit DC_PX may also have a structure in which it further includes a compensation circuit compensating for a threshold voltage deviation ΔVth of the first transistor T1, or the like.

In various embodiments, the sensing driving circuit DC_PS may include a sensing transistor LT1, a reset transistor LT2, and a photoelectric conversion device PD. In addition, the sensing driving circuit DC_PS may further include a sensing node LN electrically connected between the sensing transistor LT1, the reset transistor LT2, and the photoelectric conversion device PD. The sensing driving circuit DC_PS may receive a sensing scan signal LD, a sensing signal RX, and a reset signal RST. The sensing scan signal LD may be provided through the scan driver 400 connected to the scan line SL, but is not limited thereto. The sensing signal RX may be provided through the panel driver 20 (or the signal sensing portion) connected to the sensing line FRL. The reset signal RST may be provided through the reset signal generator 500 connected to the reset signal line RSTL.

In various embodiments, the photoelectric conversion device PD may be an organic light emitting diode or a phototransistor including an anode electrode, a cathode electrode, and an active layer ACT (see FIG. 6) disposed between the anode electrode and the cathode electrode. The anode electrode of the photoelectric conversion device PD is connected to the sensing node LN. The cathode electrode of the photoelectric conversion device PD may be connected to the second source voltage ELVSS terminal to receive the second source voltage ELVSS. The anode electrode of the photoelectric conversion device PD may correspond to a first electrode 180 of FIG. 6, and the cathode electrode of the photoelectric conversion device PD may correspond to a common electrode 190 of FIG. 6.

In various embodiments, the photoelectric conversion device PD may generate photocharges when it is exposed to external light, and the generated photocharges may be accumulated in the anode electrode of the photoelectric conversion device PD. In this case, a voltage of the sensing node LN electrically connected to the anode electrode may be boosted. When a sensing signal RX terminal is connected to the photoelectric conversion device PD, a current may flow due to a voltage difference between the sensing node LN in which charges are accumulated and the sensing line FRL.

The sensing transistor LT1 may have a gate electrode connected to a sensing scan signal LD terminal, one electrode connected to the sensing node LN, and the other electrode connected to the sensing signal RX terminal. The sensing transistor LT1 may be turned on according to the sensing scan signal LD to transfer a current flowing through the photoelectric conversion device PD to the sensing signal RX terminal.

The reset transistor LT2 may have a gate electrode connected to a reset signal RST terminal, one electrode connected to the first source voltage ELVDD terminal, and the other electrode connected to the sensing node LN. In this case, the sensing node LN and the anode electrode of the photoelectric conversion device PD may be reset to the first source voltage ELVDD.

It has been illustrated in FIG. 4 that each of the transistors is an N-channel metal oxide semiconductor (NMOS) transistor, but some or all of the transistors may also be provided as P-channel metal oxide semiconductor (PMOS) transistors.

Hereinafter, a layout of pixels PX and photosensors PS of the display layer DPL according to an embodiment will be described with reference to FIG. 5.

Figure 5:
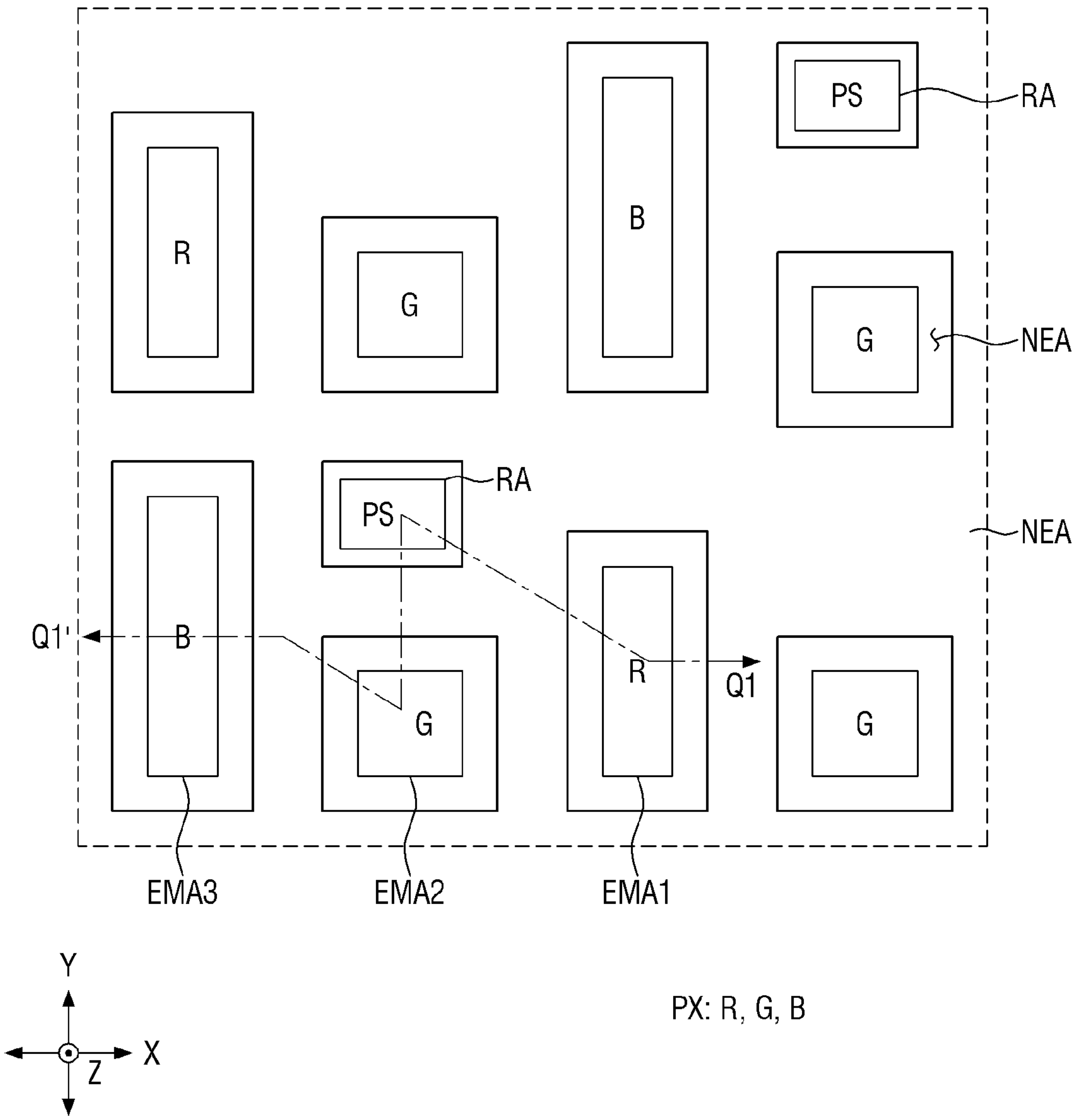
FIG. 5 is a schematic plan view illustrating a layout of pixels and photosensors of the display layer, according to an embodiment of the inventive concept.

FIG. 5 is a schematic plan view illustrating a layout of pixels and photosensors of the display layer, according to an embodiment.

In FIG. 5, the display layer DPL may include a plurality of pixels PX and a plurality of photosensors PS.

In various embodiments, the plurality of pixels PX may include a plurality of light emitting portions EMA, which may be referred to as: EMA1, EMA2, and EMA3, configured for emitting light in the active area AAR (or the display area). The plurality of light emitting portions EMA (e.g., EMA1, EMA2, EMA3, etc.) may be areas in which pixel electrodes 170 (e.g., see FIG. 6) are exposed by openings of a bank layer BK, and areas in which the exposed pixel electrodes 170 and light emitting layers 175 overlap each other, in cross-sectional view. Different light emitting portions EMA may emit different colored light, where EMA1 may be configured to emit red light, EMA2 may be configured to emit green light, and EMA3 may be configured to emit blue light (e.g., RGB).

In various embodiments, the plurality of photosensors PS may include a plurality of light sensing portions RA sensing incident light within the active area AAR (or the light sensing area). The light sensing portions RA may be defined as areas in which first electrodes 180 (e.g., see FIG. 6) are exposed by the openings of the bank layer BK, and areas in which the exposed first electrodes 180 and active layers ACT overlap each other, in cross-sectional view. The photosensors PS may be adjacent to one or more light emitting portions EMA.

A non-emission area NEA may be disposed between the light emitting portions EMA of the respective pixels PX. In addition, a non-sensing area may be disposed between the light sensing portions RA of the respective photosensors PS. In the present embodiment, it will be described that the non-emission area NEA includes the non-sensing area.

In various embodiments, the pixel PX may include a red pixel R, a green pixel G, and a blue pixel B. The respective color pixels and the respective photosensors PS may be arranged in various manners.

In an embodiment, the red pixels R and the blue pixels B may be alternately arranged in a first column along the second direction Y, where for example, the red pixel R, the blue pixel B, the red pixel R, and the blue pixel B may be sequentially arranged. In a second column adjacent to the first column, the green pixels G and the photosensors PS may be alternately arranged along the second direction Y. Color pixels belonging to the second column may be disposed to face color pixels belonging to the first column in the first direction X.

In various embodiments, the sizes of the light emitting portions EMA of the respective color pixels may be different from each other. When an emission area of the red pixel R is referred to as a first light emitting portion EMA1, an emission area of the green pixel G is referred to as a second light emitting portion EMA2, and an emission area of the blue pixel B is referred to as a third light emitting portion EMA3, the first light emitting portion EMA1 and the third light emitting portion EMA3 may have a greater size than the second light emitting portion EMA2. In addition, the first light emitting portion EMA1 may be greater than the third light emitting portion EMA3.

It has been illustrated in FIG. 5 that the light emitting portion EMA of each color pixel has a square or rectangular shape, but the present disclosure is not limited thereto, and each light emitting portion EMA may have an octagonal shape, a circular shape, a rhombic shape, or other polygonal shapes.

In various embodiments, the non-emission area NEA may be disposed along boundaries of the pixels PX and the photosensors PS. The non-emission area NEA may not overlap the light emitting portions EMA of the pixels PX and may not overlap the light sensing portions RA of the photosensors PS. A width of the non-emission area NEA may be different between the respective light emitting portions EMA and light sensing portions RA. The non-emission area NEA may expose each of the plurality of light emitting portions EMA and light sensing portions RA. The non-emission area NEA may overlap the bank layer BK.

Figure 6:
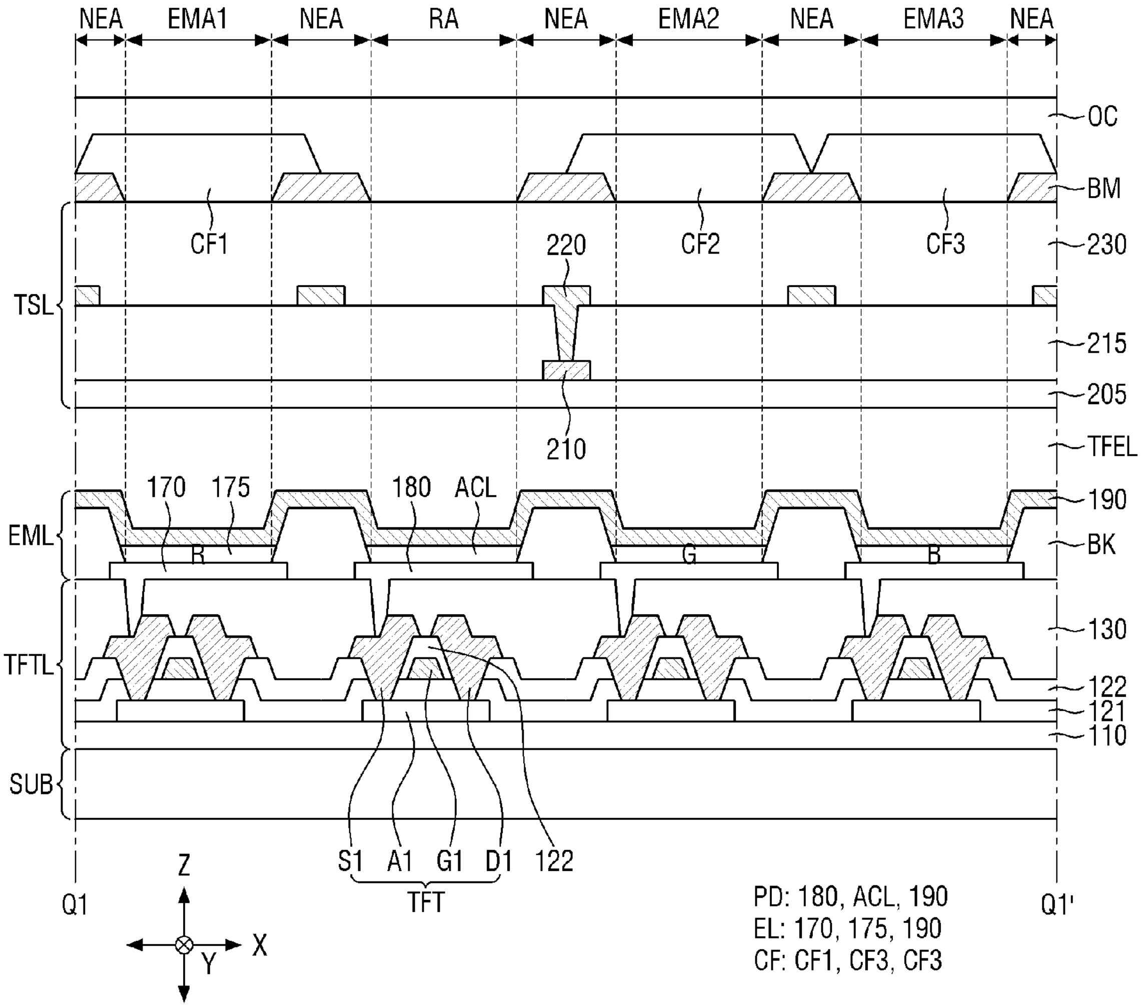
FIG. 6 is a cross-sectional view illustrating an example of the display device taken along line Q1-Q1' of FIG. 5, according to an embodiment of the inventive concept.
Figure 7:
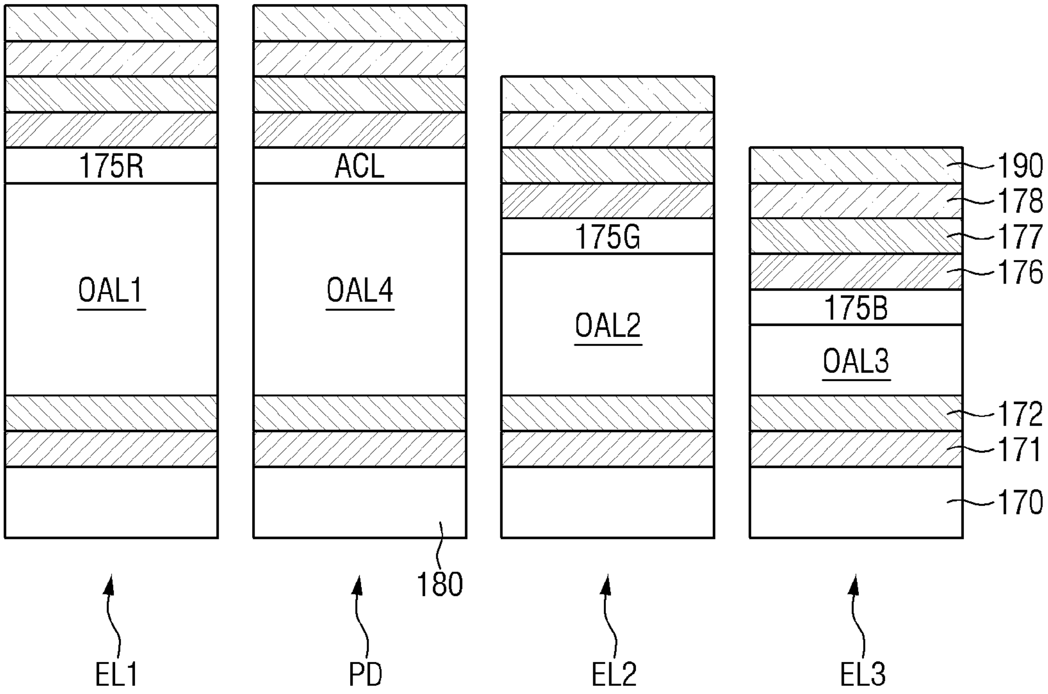
FIG. 7 is a schematic cross-sectional view illustrating light emitting elements and a photoelectric conversion device, according to an embodiment of the inventive concept.
Figure 8:
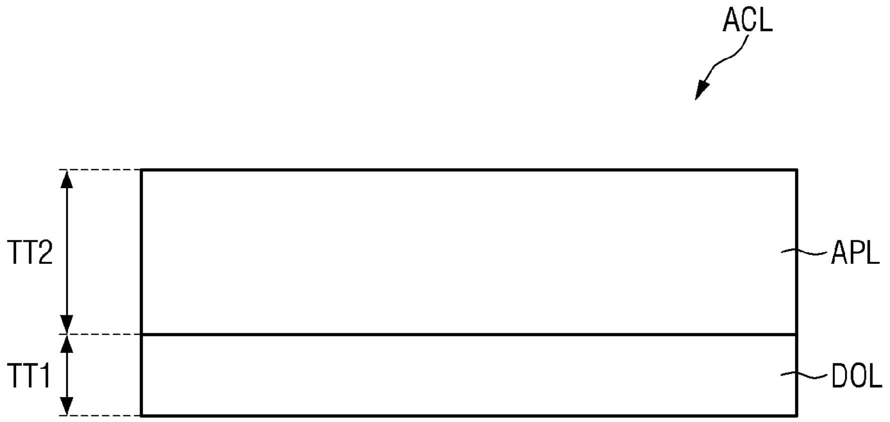
FIG. 8 is a schematic cross-sectional view illustrating an active layer of the photoelectric conversion device, according to an embodiment of the inventive concept.
Figure 9:
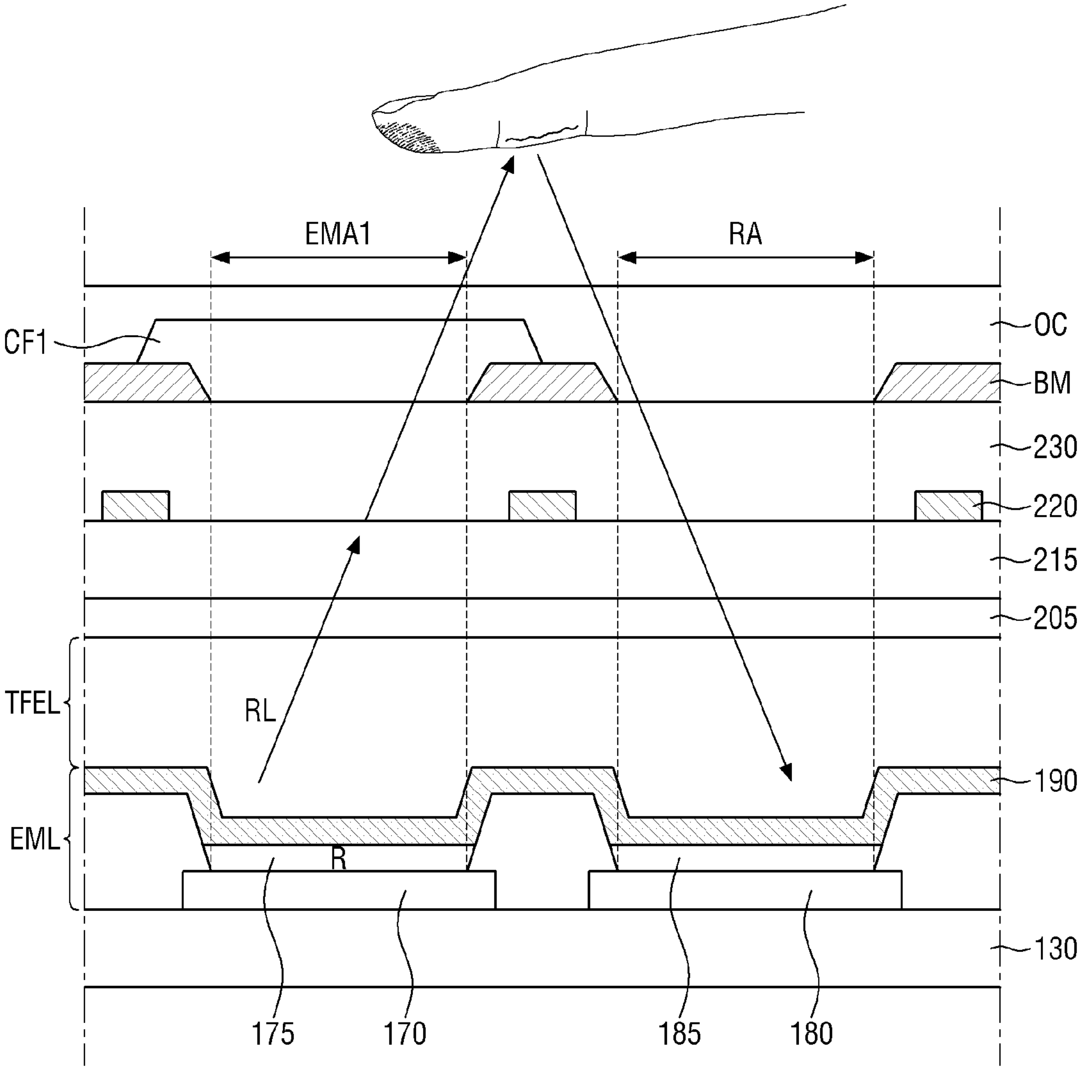
FIG. 9 is a schematic cross-sectional view illustrating that biometric information is received by a first light emitting portion and a light sensing portion, according to an embodiment of the inventive concept.

FIG. 6 is a cross-sectional view illustrating an example of the display device taken along line Q1-Q1' of FIG. 5. FIG. 7 is a schematic cross-sectional view illustrating light emitting elements and a photoelectric conversion device, according to an embodiment. FIG. 8 is a schematic cross-sectional view illustrating an active layer of the photoelectric conversion device according to an embodiment. FIG. 9 is a schematic cross-sectional view illustrating that biometric information is received by a first light emitting portion and a light sensing portion.

Referring to FIG. 6, a buffer layer 110 may be disposed on the substrate SUB. The buffer layer 110 may include silicon nitride, silicon oxide, silicon oxynitride, or the like.

Thin film transistors TFT may be disposed on the buffer layer 110. The thin film transistors TFT may include, respectively, semiconductor layers A1, a gate insulating layer 121 disposed on portions of the semiconductor layers A1, gate electrodes G1 disposed on the gate insulating layer 121, an interlayer insulating layer 122 covering each of the semiconductor layers A1 and each of the gate electrodes G1, and source electrodes S1 and drain electrodes D1 disposed on the interlayer insulating layer 122.

In various embodiments, the semiconductor layers A1 may form channels of the thin film transistors TFT, respectively. The semiconductor layer A1 may include polycrystalline silicon. In an embodiment, the semiconductor layer A1 may include single crystal silicon, low-temperature polycrystalline silicon, amorphous silicon, or an oxide semiconductor, where the oxide semiconductor may include, for example, a binary compound ($AB_x$), a ternary compound ($AB_xC_y$), or a quaternary compound ($AB_xC_yD_z$) containing indium, zinc, gallium, tin, titanium, aluminum, hafnium (Hf), zirconium (Zr), magnesium (Mg), or the like. The semiconductor layers A1 may include channel regions, and source regions and drain regions doped with impurities, respectively.

The gate insulating layer 121 may be disposed on the semiconductor layers A1. The gate insulating layer 121 may electrically insulate the gate electrodes G1 and the semiconductor layers A1 from each other. The gate insulating layer 121 may be made of an electrically insulating material, for example, silicon oxide ($SiO_x$), silicon nitride ($SiN_x$), or metal oxide.

The gate electrodes G1 of the thin film transistors TFT may be disposed on the gate insulating layer 121. The gate electrodes G1 may be formed above the channel regions of the semiconductor layers A1, where the gate electrodes G1 may be on positions of the gate insulating layer 121 overlapping the channel regions, respectively.

In various embodiments, the interlayer insulating layer 122 may be disposed on the gate electrodes G1. The interlayer insulating layer 122 may include an inorganic insulating material, such as silicon oxide ($SiO_x$), silicon nitride ($SiN_x$), silicon oxynitride, hafnium oxide, or aluminum oxide. The interlayer insulating layer 122 may include a plurality of insulating films.

In various embodiments, the source electrodes S1 and the drain electrodes D1 may be disposed on the interlayer insulating layer 122. The source electrodes S1 of the thin film transistors TFT may be electrically connected to the source regions of the semiconductor layers A1 through contact holes penetrating through the interlayer insulating layer 122 and the gate insulating layer 121. The source electrode S1 and the drain electrode D1 may include one or more metals selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

In various embodiments, a planarization layer 130 may be disposed on the thin film transistors TFT. The planarization layer 130 may be disposed on the interlayer insulating layer 122, so as to cover the source electrodes S1 and the drain electrodes D1. The planarization layer 130 may be made of an organic insulating material or the like. The planarization layer 130 may have a flat surface and include contact holes exposing any one of the source electrodes S and any one of the drain electrodes D.

The light emitting element layer EML may be disposed on the planarization layer 130. The light emitting element layer EML may include light emitting elements EL, photoelectric conversion devices PD, and a bank layer BK. The light emitting element EL may include a pixel electrode 170, a light emitting layer 175, and a common electrode 190, and the photoelectric conversion device PD may include a first electrode 180, an active layer ACL, and a common electrode 190. The common electrode may be electrically connected to both the photoelectric conversion device PD and the light emitting elements EL.

In various embodiments, the pixel electrodes 170 of the light emitting elements EL may be disposed on the planarization layer 130. A pixel electrode 170 may be provided for each pixel PX. The pixel electrode 170 may be connected to the source electrode S1 or the drain electrode D1 of the thin film transistor TFT through a contact hole penetrating through the planarization layer 130.

In various embodiments, the pixel electrode 170 of the light emitting element EL may have a single-layer structure of molybdenum (Mo), titanium (Ti), copper (Cu), or aluminum (Al), or may have a stacked film structure, for example, a multilayer structure of ITO/Mg, ITO/MgF. ITO/Ag, or ITO/Ag/ITO including indium-tin-oxide (ITO), indium-zinc-oxide (IZO), zinc oxide (ZnO), or indium oxide ($In_2O_3$), and silver (Ag), magnesium (Mg), aluminum (Al), platinum (Pt), lead (Pb), gold (Au), or nickel (Ni), but is not limited thereto.

In various embodiments, the first electrodes 180 of the photoelectric conversion devices PD may be disposed on the planarization layer 130. A first electrode 180 may be provided for each photosensor PS. The first electrode 180 may be connected to the source electrode S1 or the drain electrode D1 of the thin film transistor TFT through a contact hole penetrating through the planarization layer 130.

In various embodiments, the first electrode 180 of the photoelectric conversion device PD may have a single-layer structure of molybdenum (Mo), titanium (Ti), copper (Cu), or aluminum (Al), or may have a multilayer structure of ITO/Mg, ITO/MgF, ITO/Ag, or ITO/Ag/ITO, but is not limited thereto.

In various embodiments, the bank layer BK may be disposed on the pixel electrodes 170 and the first electrodes 180. The bank layer BK may include openings formed in areas overlapping the pixel electrodes 170 and exposing at least a portion of the pixel electrodes 170. Areas in which the exposed pixel electrodes 170 and the light emitting layers 175 overlap each other may be defined as first to third light emitting portions EMA1, EMA2, and EMA3 according to color pixels R, G, and B included in each pixel PX.

In addition, the bank layer BK may include openings formed in areas overlapping the first electrodes 180 and exposing the first electrodes 180. The openings exposing the first electrodes 180 may provide spaces in which the active layers ACL of the respective photosensors PS are formed, and areas in which the exposed first electrodes 180 and the active layers ACL overlap each other may be defined as light sensing portions RA.

In various embodiments, the bank layer BK may include an organic insulating material, such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). As another example, the bank layer BK may also include an inorganic material, such as silicon nitride.

The light emitting layers 175 may be disposed on the pixel electrodes 170 of the light emitting elements EL exposed by the openings of the bank layer BK. The light emitting layer 175 may include a high molecular material or a low molecular material, which may emit red, green, or blue light for each of the color pixels R. G, and B included in each pixel PX. The light emitted from the light emitting layer 175 may contribute to image display or function as a light source incident on the photosensor PS. For example, a light source of a blue wavelength emitted from the third light emitting portion EMA3 of the blue pixel B may function as a light source incident to the light sensing portion RA of the photosensor PS.

In various embodiments, the active layers ACL may be disposed on the first electrodes 180 of the photoelectric conversion devices PD exposed by the openings of the bank layer BK, where the bank layer BK may form a boarder around the active layers ACL. The active layers ACL may generate photocharges in proportion to incident light. The incident light may be light emitted from the light emitting layers 175 and then reflected to enter the active layers ACL or may be light provided from the outside regardless of the light emitting layers 175. Charges generated and accumulated in the active layers ACL may be converted into electrical signals involved in sensing.

It has been described by way of example in the present disclosure that areas in which the light emitting layers 175 and the active layers ACL are disposed are substantially the same as the light emitting portions EMA and the light sensing portions RA, respectively, but the light emitting layers 175 may also be disposed to cover the bank layer BK beyond the light emitting portions EMA, and the active layers ACL may also be disposed to cover the bank layer BK beyond the light sensing portions RA.

In various embodiments, the common electrode 190 may be disposed on the light emitting layers 175, the active layers ACL, and the bank layer BK. The common electrode 190 may be disposed throughout the plurality of pixels PX and the plurality of photosensors PS in a form in which the common electrode 190 covers the light emitting layers 175, the active layers ACL, and the bank layer BK. The common electrode 190 may include a conductive material having a small work function, for example, Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). Alternatively, the common electrode 190 may include transparent metal oxide, for example, indium-tin-oxide (ITO), indium-zinc-oxide (IZO), or zinc oxide (ZnO).

The photoelectric conversion devices PD and the light emitting elements EL may share the common electrode 190 disposed on the active layers ACL and the light emitting layers 175 with each other, but are not limited thereto.

Referring to FIGS. 7 and 8, the light emitting elements EL and the photoelectric conversion device PD will be described in more detail.

A first light emitting element EL1, a second light emitting element EL2, and a third light emitting element EL3 may be disposed in the first light emitting portion EMA1, the second light emitting portion EMA2, and the third light emitting portion EMA3, respectively. The first light emitting element EL1 may be disposed in the first light emitting portion EMA1, the second light emitting element EL2 may be disposed in the second light emitting portion EMA2, and the third light emitting element EL3 may be disposed in the third light emitting portion EMA3. In addition, the photoelectric conversion device PD may be disposed in the light sensing portion RA. The first light emitting element EL1, second light emitting element EL2, third light emitting element EL3, and photoelectric conversion device PD may be adjacent to each other.

In various embodiments, the respective light emitting elements EL1, EL2, and EL3 may include the pixel electrodes 170 disposed to overlap the respective light emitting portions EMA1, EMA2, and EMA3. The photoelectric conversion device PD may include the first electrode 180 disposed to overlap the light sensing portion RA.

The respective light emitting elements EL1, EL2, and EL3 and the photoelectric conversion device PD may include hole injection layers 171, hole transport layers 172, resonance layers OAL, buffer layers 176, electron transport layers 177, and electron injection layers 178, as well as light emitting layers 175 for each of the colors.

The hole injection layers 171 may be disposed on the pixel electrodes 170 and the first electrode 180, respectively. The hole injection layer 171 may serve to facilitate transport of holes and may include a hole injection material. The hole injection material may include one or more selected from the group consisting of copper phthalocyanine (CuPc), poly(3,4)-ethylenedioxythiophene (PEDOT), polyaniline (PANI), and N,N-dinaphthyl-N,N'-diphenyl benzidine (NPD), but is not limited thereto. The hole injection layer 171 may further include a p-type dopant material in addition to the hole injection material.

The hole transport layers 172 may be disposed on the hole injection layers 171. The hole transport layer 172 may serve to facilitate transport of holes and may include a hole transport material. The hole transport material may include a carbazole-based derivative such as N-phenylcarbazole and polyvinylcarbazole, a fluorene-based derivative, a triphenylamine-based derivative, such as N,N'-bis(3-methylphenyl)-N,N'-diphenyl-[1,1-biphenyl]-4,4'-diamine (TPD) and (TCTA), 4,4',4"-tris(N-carbazolyl)triphenylamine N,N'-di(1-naphthyl)-N,N'-diphenylbenzidine (NPB), 4.4'-cyclohexylidene bis[N,N-bis(4-methylphenyl)benzenamine] (TAPC), and the like, but is not limited thereto.

The resonance layers OAL may be disposed on the hole transport layers 172. The resonance layers OAL may serve to form resonance thicknesses in order to generate a resonance phenomenon in which light emitted from the light emitting layers 175 of the respective light emitting elements EL1, EL2, and EL3 is reflected between the common electrode 190 and the pixel electrodes 170 to cause constructive interference. The resonance layers OAL may be formed to have different thicknesses in each of the light emitting elements EL1, EL2, and EL3 in order to form resonance frequencies of light emitting materials of the respective light emitting layers 175. In addition, the photoelectric conversion device PD may also include a resonance layer OAL in order to increase efficiency of light reflected from a user's body and incident on the photoelectric conversion device PD. The resonance layer OAL can include a first resonance layer OAL1 having a first thickness disposed in the first light emitting element EL1, a second resonance layer OAL2 having a second thickness disposed in the second light emitting element EL2, a third resonance layer OAL3 having a third thickness disposed in the third light emitting element EL3, and a fourth resonance layer OAL4 having a fourth thickness disposed in the photoelectric conversion device PD. The thickness of each of the resonance layers of the light emitting elements may be different from each other, where the light emitting elements may be configured to emit light of different colors.

In various embodiments, the resonance layer OAL may include a first resonance layer OAL1 disposed in the first light emitting element EL1, a second resonance layer OAL2 disposed in the second light emitting element EL2, a third resonance layer OAL3 disposed in the third light emitting element EL3, and a fourth resonance layer OAL4 disposed in the photoelectric conversion device PD. A thickness of the first resonance layer OAL1 may be greater than thicknesses of the second resonance layer OAL2 and the third resonance layer OAL3, and a thickness of the second resonance layer OAL2 may be greater than a thickness of the third resonance layer OAL3. A distance from an upper surface of the pixel electrode 170 of the first light emitting element EL1 to a lower surface of the light emitting layer 175 can be the same as a distance from an upper surface of the first electrode 180 of the photoelectric conversion device PD to a lower surface of the active layer ACT.

According to the present embodiment, the first resonance layer OAL1 and the fourth resonance layer OAL4 may have the same thickness. The first thickness may be greater than the second thickness and the third thickness. In addition, a distance from an upper surface of the pixel electrode 170 of the first light emitting element EL1 to a lower surface of a first light emitting layer 175R of the first light emitting element EL1 may be the same as a distance from an upper surface of the first electrode 180 of the photoelectric conversion device PD to a lower surface of the active layer ACL of the photoelectric conversion device PD. In various embodiments, red light emitted from the first light emitting element EL1 may be reflected from the user's body and be incident on the photoelectric conversion device PD. Since the first light emitting element EL1 from which the red light is emitted and the photoelectric conversion device PD on which the red light is incident and sensed have the same resonance distance, efficiency of the red light may be increased to improve luminous efficiency and light sensing efficiency. The first resonance layer OAL1 and the fourth resonance layer OAL4 may be formed with the same thickness through the same process. The resonance layer OAL may include a hole transport material, but is not limited thereto.

In the respective light emitting elements EL1, EL2, and EL3, the light emitting layers 175 may be disposed on the resonance layers OAL1, OAL2, and OAL3. The light emitting layer 175 may include a first light emitting layer 175R disposed in the first light emitting element EL1, a second light emitting layer 175G disposed in the second light emitting element EL2, and a third light emitting layer 175B disposed in the third light emitting element EL3, where the first light emitting layer 175R may emit light of a first color, for example, red light (R), the second light emitting layer 175G may emit light of a second color, for example, green light (G), and the third light emitting layer 175B may emit light of a third color, for example, blue light (B). That is, emitted light finally emitted from the respective light emitting layers 175 may be the red light from the first light emitting portion EMA1, green light from the second light emitting portion EMA2, and blue light from the third light emitting portion EMA3.

In various embodiments, the first light emitting layer 175R emitting the red light may be made of a phosphorescent material including a host material including carbazole biphenyl (CBP) or 1,3-bis(carbazol-9-yl) (mCP) and including a dopant including one or more compounds selected from the group consisting of bis(1-phenylisoquinoline) acetylacetonate iridium (PIQIr (acac)), bis(1-phenylquinoline) acetylacetonate iridium (PQIr (acac)), tris(1-phenylquinoline) iridium (PQIr), and platinum octaethylporphyrin (PtOEP) or may be made of a fluorescent material including PBD: $Eu(DBM)_3$ (Phen) or perylene, but is not limited thereto.

In various embodiments, the second light emitting layer emitting the green light may be made of a phosphorescent material including a host material including CBP or mCP and including a dopant including fac-tris(2-phenylpyridine) iridium ($Ir(ppy)_3$) or be made of a fluorescent material including tris(8-hydroxyquinolino)aluminum (Alq3), but is not limited thereto.

In various embodiments, the third light emitting layer 175B emitting the blue light may include a host and a dopant. The host may be, for example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl) anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl) anthracene (TBADN), distyrylarylene (DSA), 4,4'-bis(9-carbazolyl)-2,2"-dimethyl-biphenyl (CDBP), 2-methyl-9, 10-bis(naphthalen-2-yl) anthracene (MADN), and the like. In addition, the third light emitting layer 175B may include, for example, a fluorescent material including one selected from the group consisting of spiro-DPVBi, spiro-6P, distyryl-benzene (DSB), distyryl-arylene (DSA), a polyfluorene (PFO)-based polymer, and a poly(p-phenylene vinylene) (PPV)-based polymer. As another example, the third light emitting layer 175B may include a phosphorescent material including an organometallic complex such as (4,6-F2ppy)2Irpic.

The photoelectric conversion device PD may include the active layer ACL disposed on the fourth resonance layer OAL4. The active layer ACL may include a donor layer DOL and an acceptor layer APL, as illustrated in FIG. 8. The donor layer DOL may include an electron donor material, and the acceptor layer APL may include an electron acceptor material. The electron donor material may generate donor ions in response to light, and the electron acceptor material may generate acceptor ions in response to light.

In an embodiment, the donor layer DOL may include a material absorbing the red light, where the donor layer DOL may include a p-type compound. Specifically, the donor layer DOL may include a compound represented by Formula 1:

[Formula 1]

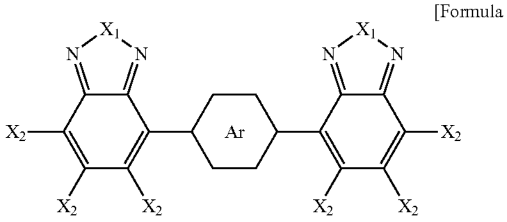

wherein Ar may independently be selected from the group consisting of a substituted or unsubstituted $C_4$ to $C_{30}$ carbocyclic ring, heterocyclic ring, or condensed rings thereof. The carbocyclic ring and the heterocyclic ring may each be monosubstituted or polysubstituted with the substituents selected from the group consisting of a halogen, a cyano group, a $C_1$ to $C_{10}$ alkyl group, an alkoxy group, an aryl group, or an aryloxy group. Each $X_1$ may be selected from the group consisting of N, O, S or Se, and each $X_2$ may be selected from the group consisting of hydrogen, a halogen, or a cyano group.

The compound represented by Formula 1 may include the following compounds of D01 to D50:

D01

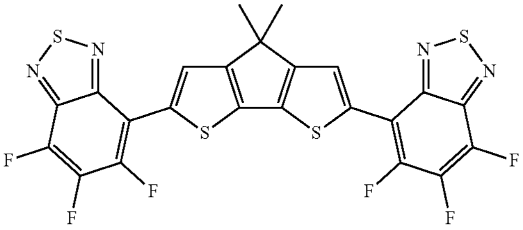

D02

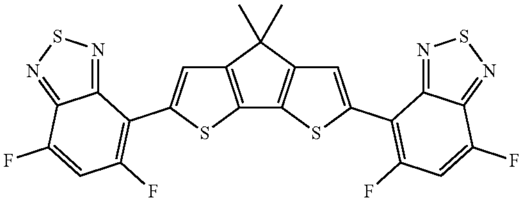

D03

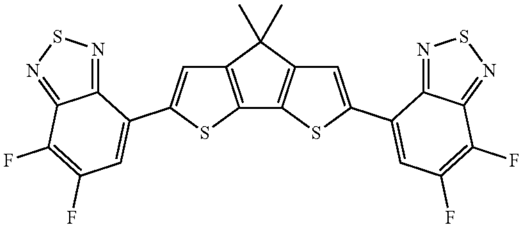

D04

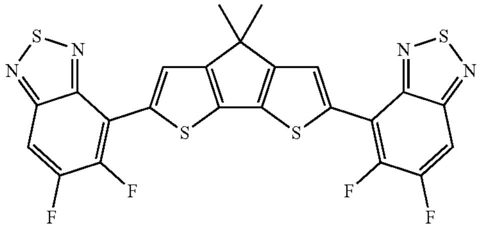

D05

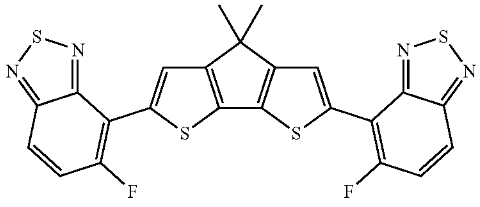

D06

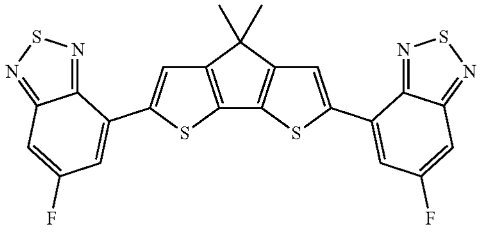

-continued
D07
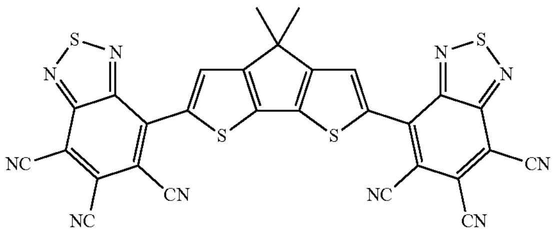
D08
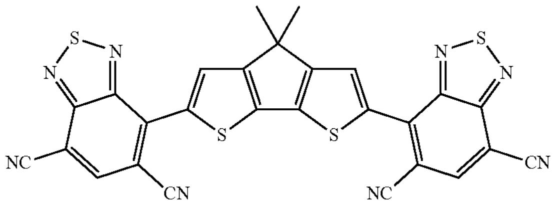
D09
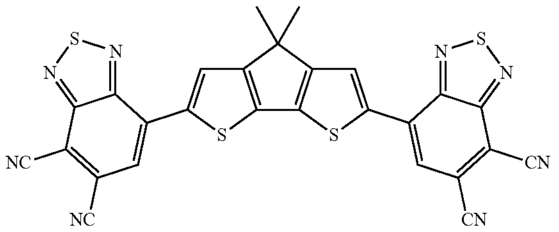
D10
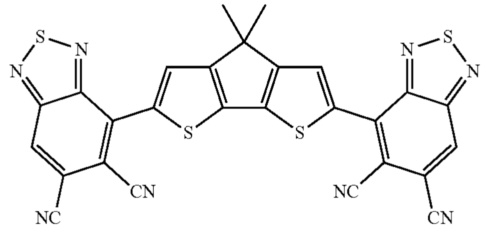
D11
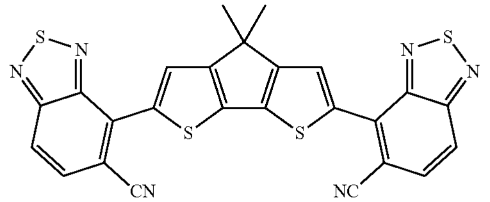
D12
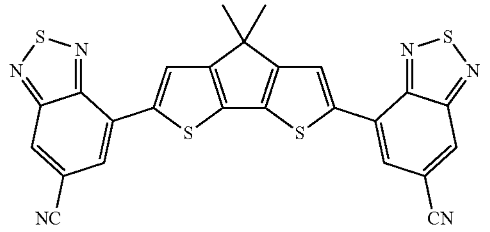
-continued
D13
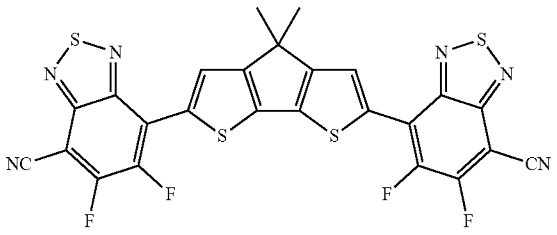
D14
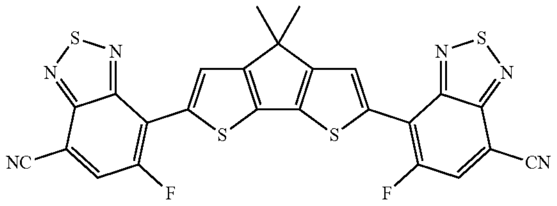
D15
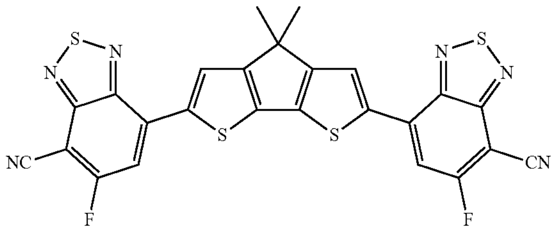
D16
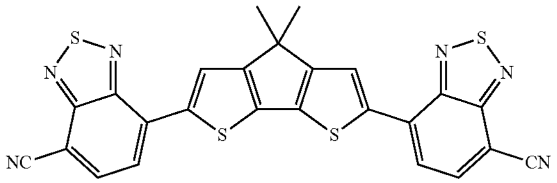
D17
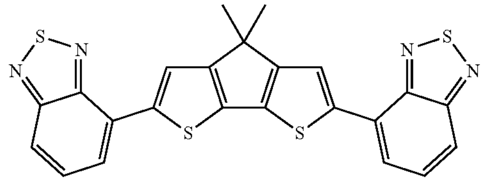
D18
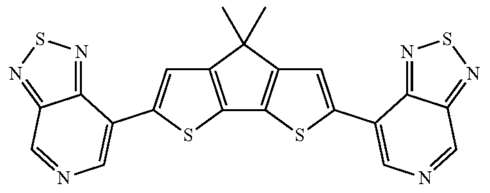
D19
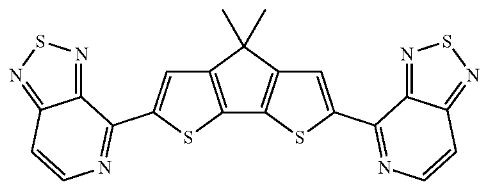

-continued
D20
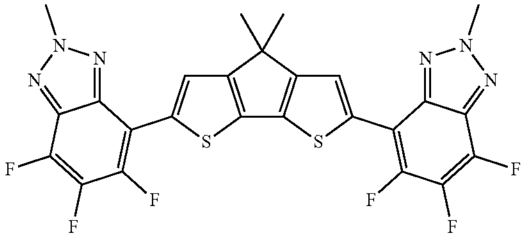
D21
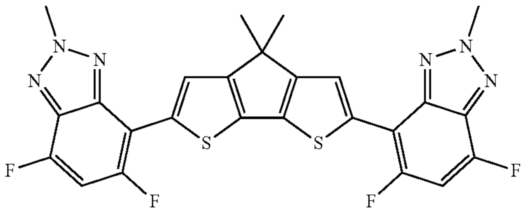
D22
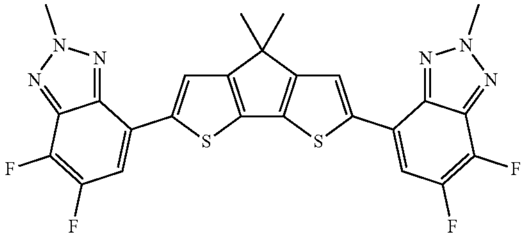
D23
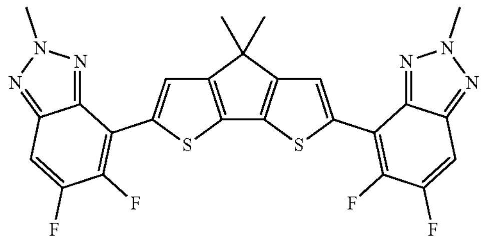
D24
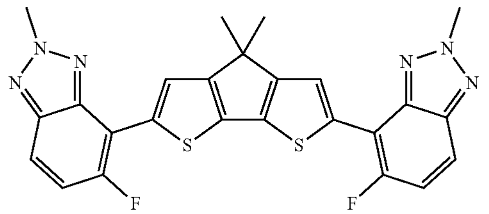
D25
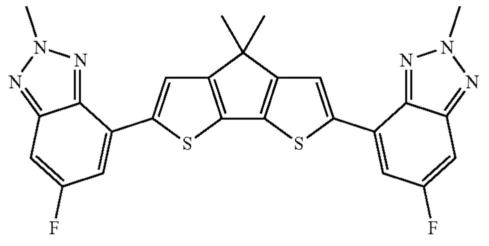
-continued
D26
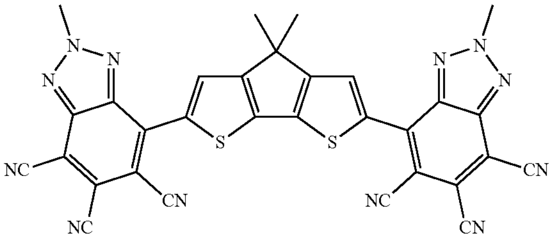
D27
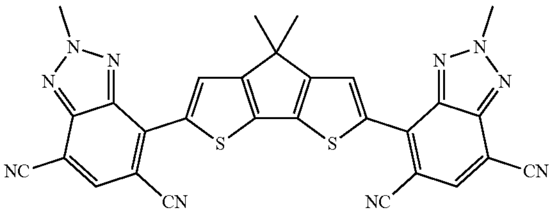
D28
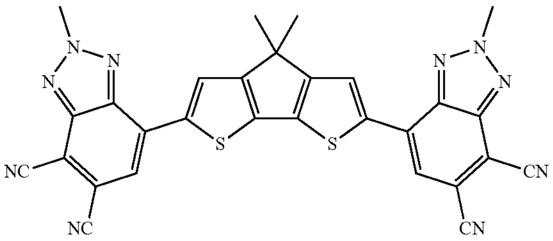
D29
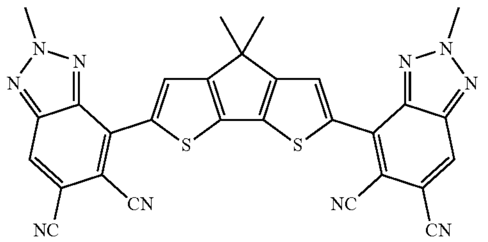
D30
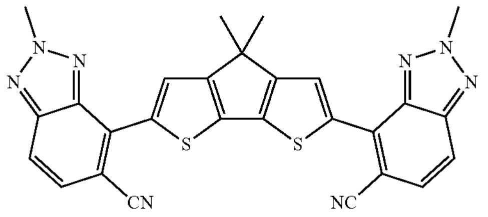
D31
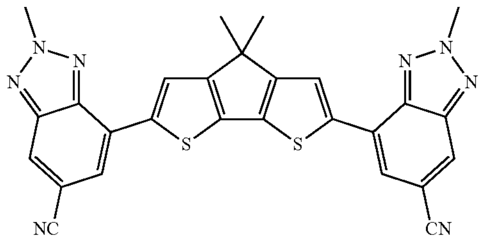

-continued
D32
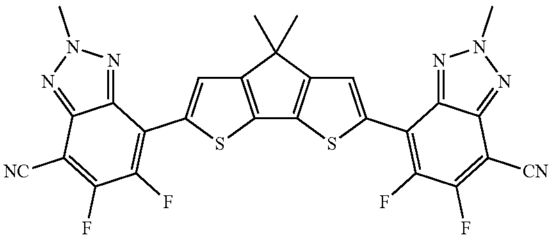
D33
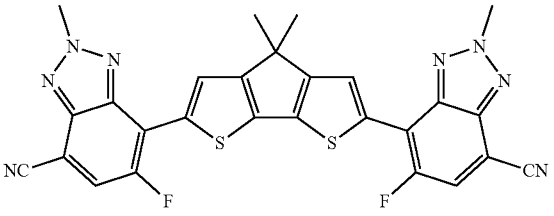
D34
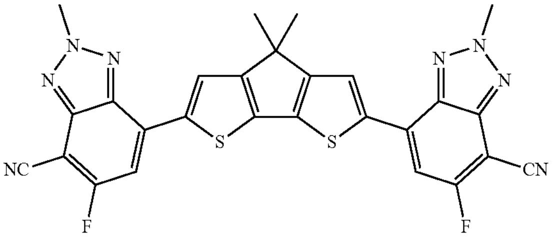
D35
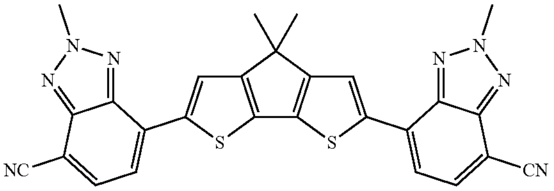
D36
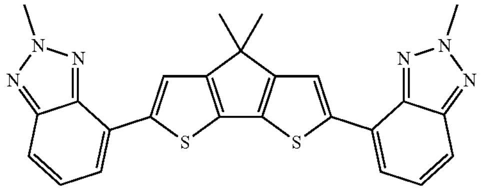
D37
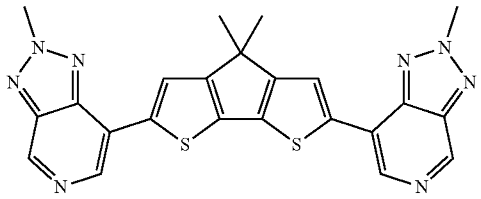
D38
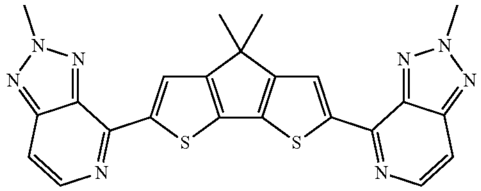
-continued
D39
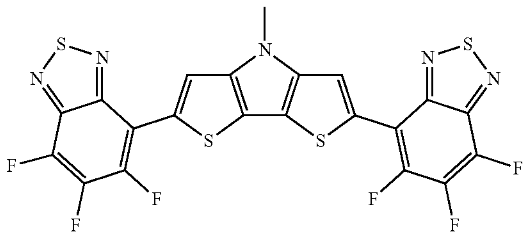
D40
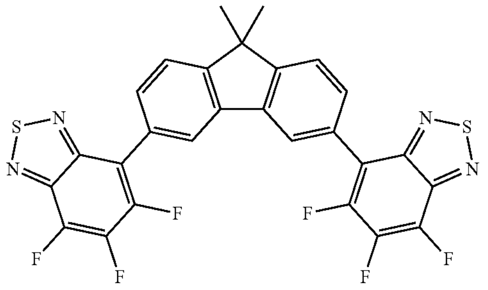
D41
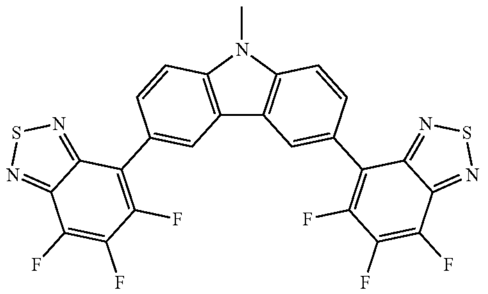
D42
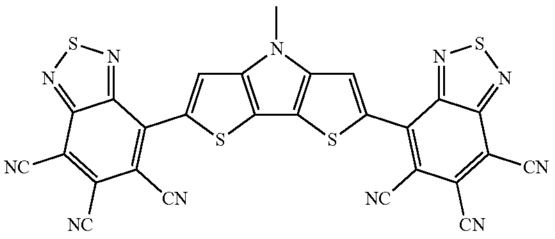
D43
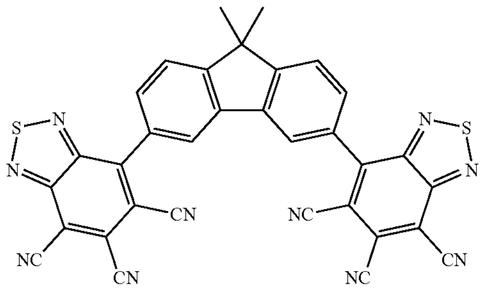

-continued

D44

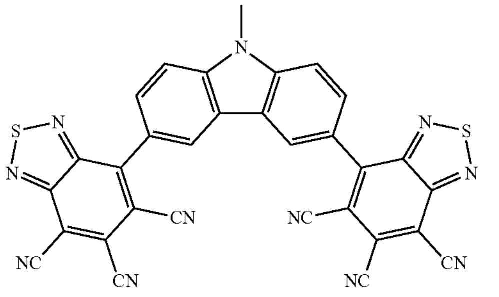

D45

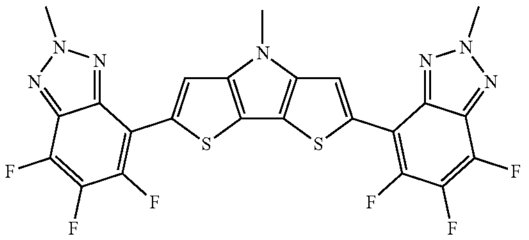

D46

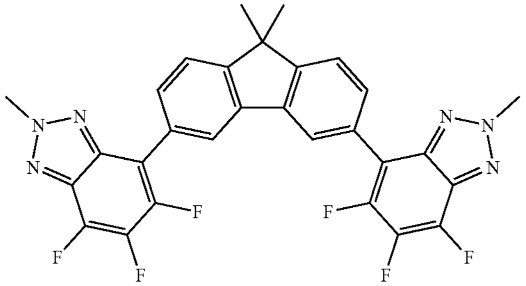

D47

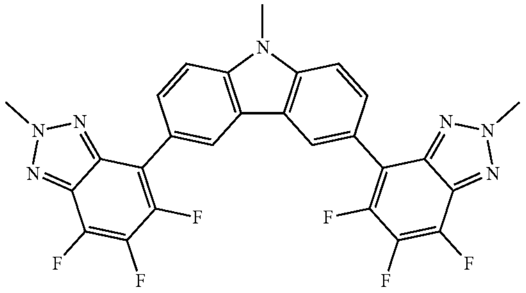

D48

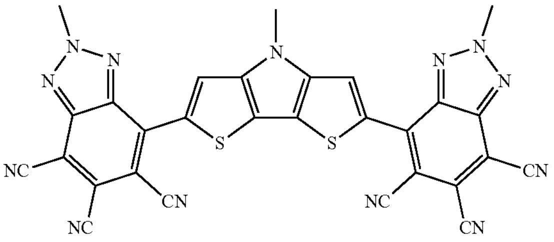

-continued

D49

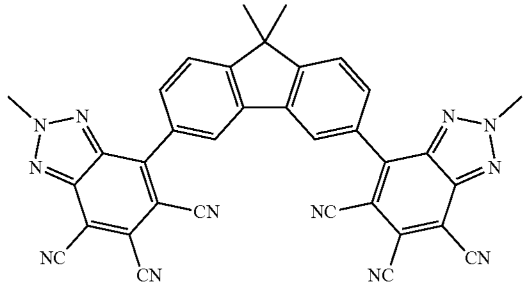

D50

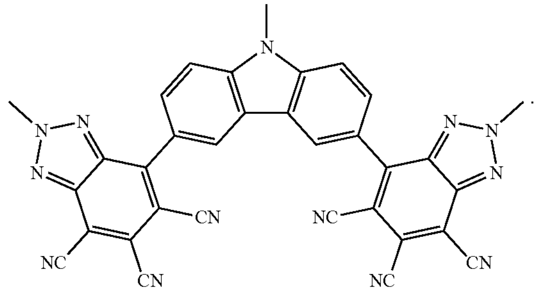

The compound represented by Formula 1 may have a HOMO level of −5.0 to −6.5 eV and a LUMO level of −3.0 to −4.5 eV. The compound represented by Formula 1 may absorb a wavelength of a red wavelength band as a maximum absorption wavelength according to a substituent. Accordingly, by including the compound represented by Formula 1 in the donor layer DOL of the active layer ACL of the photoelectric conversion device PD, the red light emitted from the first light emitting element EL1 may be absorbed to improve light sensing characteristics.

The donor layer DOL may be directly disposed on the fourth resonance layer OAL4. The donor layer DOL may be formed to have a predetermined thickness in consideration of luminous efficiency and dark current characteristics. In an embodiment, a thickness TT1 of the donor layer DOL may be about 200 Å or less, or about 100 to about 200 Å.

In an embodiment, the acceptor layer APL may include an n-type compound, and specifically, may include a compound represented by Formula 2:

[Formula 2]

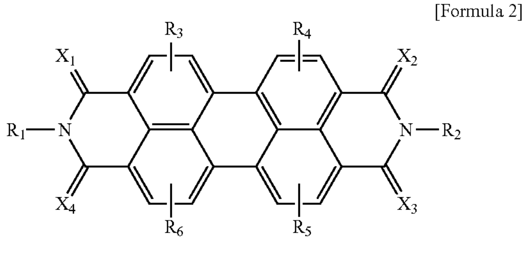

wherein $R_1$ and $R_2$ may each independently be selected from the group consisting of $C_1$ to $C_{10}$ or $C_3$ to $C_{10}$ cycloalkyl substituted or unsubstituted, $C_3$ to $C_{10}$ heterocycloalkyl substituted or unsubstituted, $C_3$ to $C_{10}$ cycloalkenyl substituted or unsubstituted, and $C_3$ to $C_{10}$ heterocycloalkenyl substituted or unsubstituted with a substituent of hydrogen, deuterium, halogen, nitrogen, oxygen, boron, silicon, sulfur, sulfur dioxide, phosphorus, or phosphorus oxide.

In addition, $R_3$, $R_4$, $R_5$, and $R_6$ may each independently be selected from the group consisting of $C_1$ to $C_{10}$ or $C_3$ to $C_{10}$ cycloalkyl substituted or unsubstituted, $C_3$ to $C_{10}$ heterocycloalkyl substituted or unsubstituted, $C_3$ to $C_{10}$ cycloalkenyl substituted or unsubstituted, $C_3$ to $C_{10}$ heterocycloalkenyl substituted or unsubstituted, $C_6$ to $C_{60}$ aryl substituted or unsubstituted, $C_2$ to $C_{60}$ heteroaryl substituted or unsubstituted, a non-aromatic condensed polycyclic group substituted or unsubstituted, and a non-aromatic heterocondensed polycyclic group substituted or unsubstituted with a substituent of hydrogen, deuterium, halogen, nitrogen, oxygen, boron, silicon, sulfur, sulfur dioxide, phosphorus, or phosphorus oxide.

In addition. $X_1$. $X_2$. $X_3$, and $X_4$ may each independently be oxygen.

The compound represented by Formula 2 may include the following compounds of A01 to A18:

A01

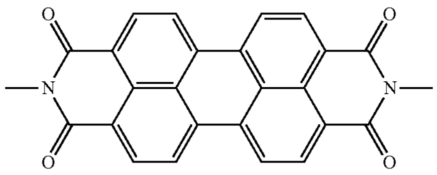

A02

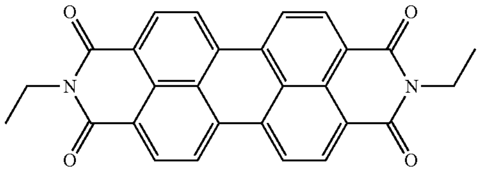

A03

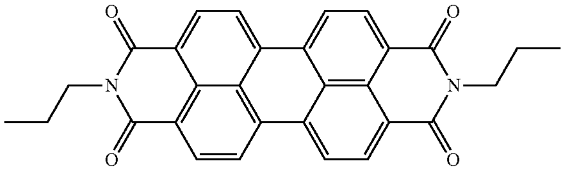

A04

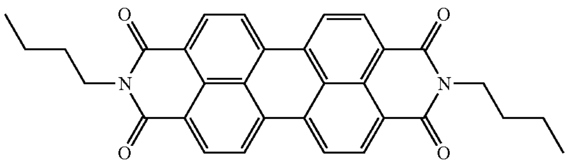

A05

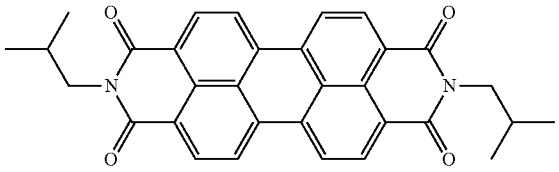

A06

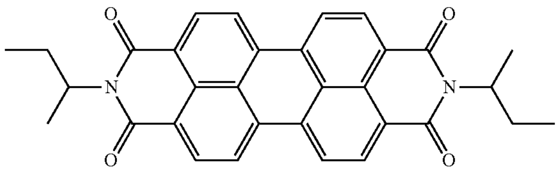

-continued

A07

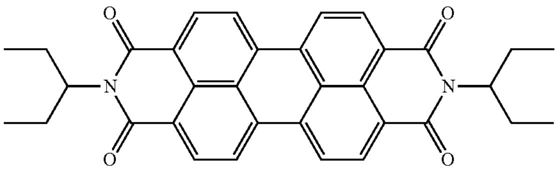

A08

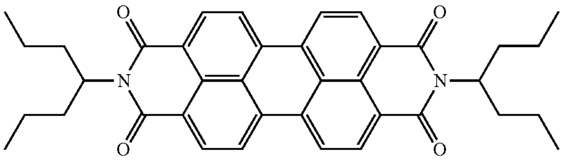

A09

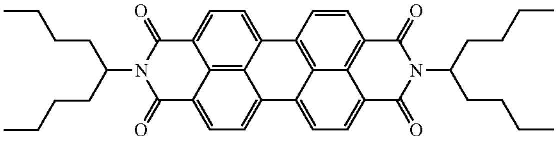

A10

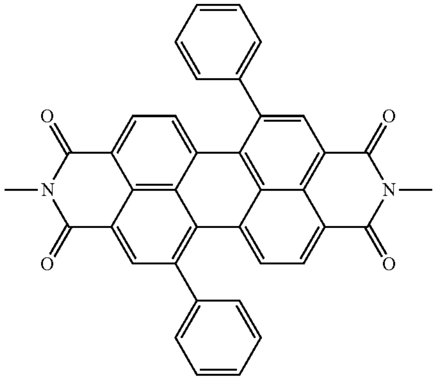

A11

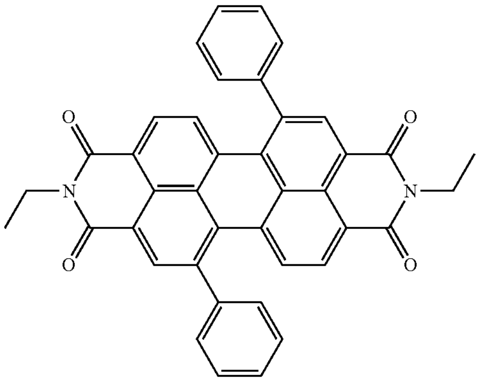

-continued

A12

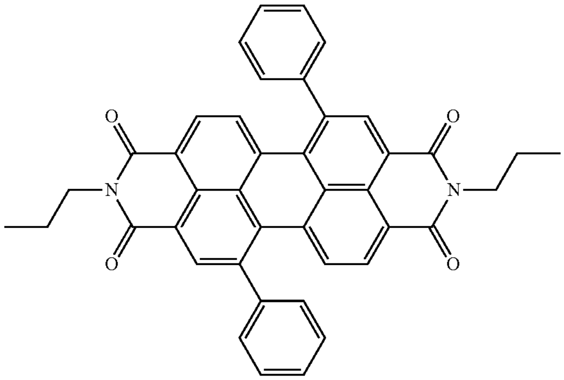

A13

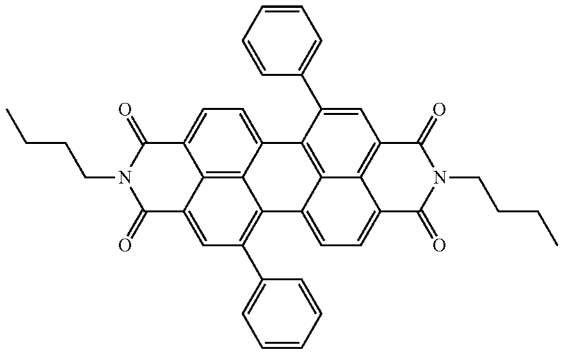

A14

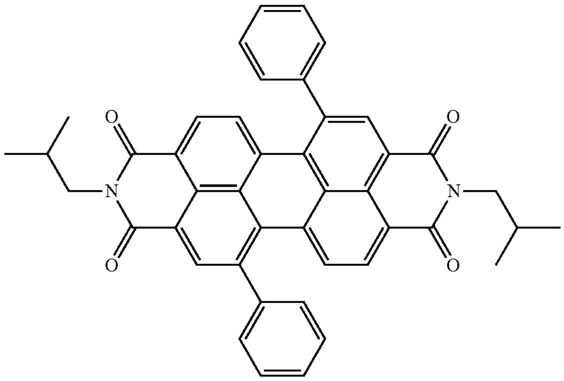

A15

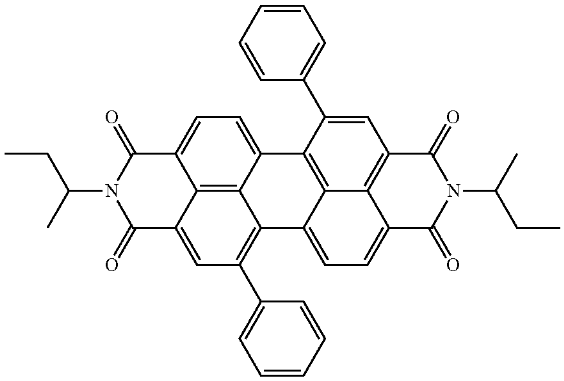

-continued

A16

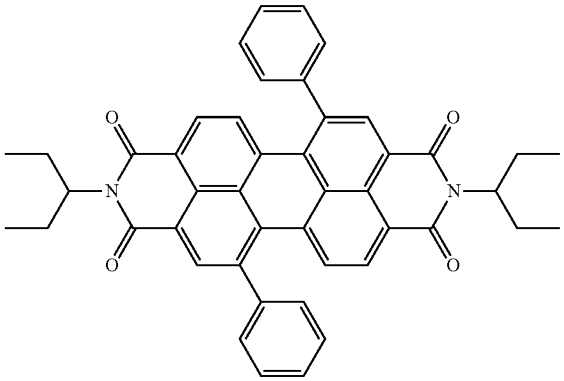

A17

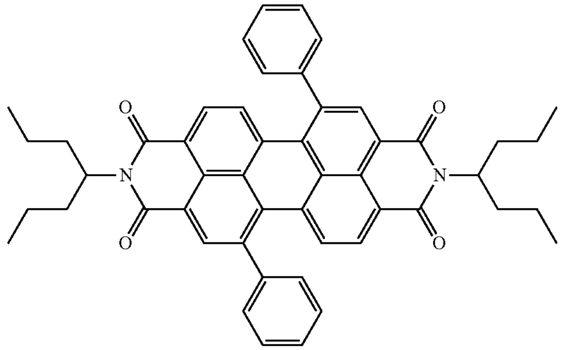

A18

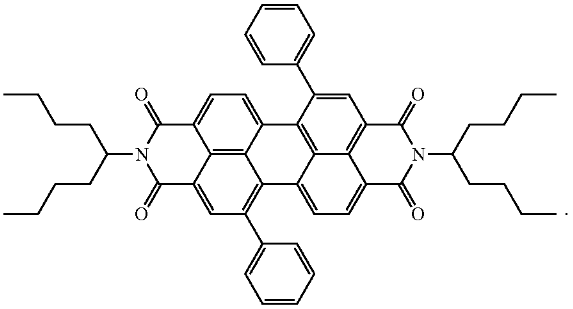

In various embodiments, the acceptor layer APL may be directly disposed on the donor layer DOL. The acceptor layer APL may be formed to have a predetermined thickness in consideration of luminous efficiency and dark current characteristics. In an embodiment, a thickness TT2 of the acceptor layer APL may be about 500 Å or less, or about 300 to about 500 Å.

In various embodiments, the donor layer DOL and the acceptor layer APL may be formed as one layer, where for example, the donor layer DOL and the acceptor layer APL may be formed as a mixed layer in which a p-type semiconductor and an n-type semiconductor are mixed with each other.

In various embodiments, the buffer layers 176 may be disposed on the light emitting layers 175R, 175G, and 175B and the active layer ACL, respectively. The buffer layers 176 may prevent holes from flowing from the light emitting layers 175R, 175G, and 175B and the active layer ACL into the common electrode 190. The buffer layers 176 may include a material having hole characteristics, for example, a hole transport material, but are not limited thereto.

In various embodiments, the electron transport layers 177 may be disposed on the buffer layers 176, respectively. The electron transport layer 177 may include an electron transport material, such as tris(8-hydroxyquinolinato)aluminum (Alq3), 1,3,5-tri (1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), and mixtures thereof.

In various embodiments, the electron injection layers 178 may be disposed on the electron transport layers 177, respectively. The electron injection layer 178 may serve to facilitate injection of electrons and may be made of tris(8-hydroxyquinolino)aluminum (Alq3), PBD, TAZ, spiro-PBD, BAlq, or SAlq, but is not limited thereto. In addition, the electron injection layer 178 may include a metal halide compound, for example, one or more selected from the group consisting of $MgF_2$, LiF, NaF, KF, RbF, CsF, FrF, LiI, NaI, KI, RbI, CsI, FrI, and $CaF_2$, but is not limited thereto. In addition, the electron injection layer 178 may include a lanthanide group material, such as Yb, Sm, or Eu. In addition, the electron injection layer 178 may include both a metal halide material and a lanthanide group material, such as RbI:Yb or KI:Yb.

In various embodiments, the common electrode 190 may be disposed on the electron injection layers 178 of the respective light emitting elements EL1, EL2, and EL3 and the photoelectric conversion device PD. The common electrode 190 may be continuously disposed as a common layer in the respective light emitting elements EL1, EL2, and EL3 and the photoelectric conversion device PD, as illustrated in FIG. 6.

Referring to FIG. 6, the encapsulation layer TFEL may be disposed on the light emitting element layer EML. The encapsulation layer TFEL may include at least one inorganic film in order to prevent oxygen or moisture from penetrating into each of the light emitting layers 175 and the active layers ACL. In addition, the encapsulation layer TFEL may include at least one organic film in order to protect each of the light emitting layers 175 and the active layers ACL from foreign substances such as dust. For example, the encapsulation layer TFEL may be formed in a structure in which a first inorganic film, an organic film, and a second inorganic film are sequentially stacked. The first inorganic film and the second inorganic film may be formed as multiple films in which one or more inorganic films of a silicon nitride layer, a silicon oxynitride layer, a silicon oxide layer, a titanium oxide layer, and an aluminum oxide layer are alternately stacked. The organic film may be an organic film made of an acrylic resin, an epoxy resin, a phenolic resin, a polyamide resin, a polyimide resin, or the like.

In various embodiments, the touch sensing layer TSL may be disposed on the encapsulation layer TFEL, where the touch sensing layer TSL may be directly on the encapsulation layer TFEL. The touch sensing layer TSL may include a base layer 205, a first touch conductive layer 210, a first insulating layer 215, a second touch conductive layer 220, and a second insulating layer 230. The base layer 205 may be directly on the encapsulation layer TFEL.

In various embodiments, the first touch conductive layer 210 may be disposed to overlap the bank layer BK, and may be disposed in the non-emission area NEA. The first touch conductive layer 210 may not overlap the light emitting portion EMA and the light sensing portion RA, such that the first touch conductive layer 210 would not block emitted light or incident light from the light emitting portion EMA or the light sensing portion RA. Accordingly, the first touch conductive layer 210 may not hinder light emission, and may not be visually recognized by a user.

In various embodiments, the second touch conductive layer 220 may be disposed to overlap the bank layer BK, and may be disposed in the non-emission area NEA. The second touch conductive layer 220 may not overlap the light emitting portion EMA and the light sensing portion RA, such that the second touch conductive layer 220 would not block emitted light or incident light from the light emitting portion EMA or the light sensing portion RA. Accordingly, the second touch conductive layer 220 may not hinder light emission, and may not be visually recognized by a user.

In various embodiments, the first insulating layer 215 may insulate the first touch conductive layer 210 and the second touch conductive layer 220 from each other. The first insulating layer 215 may include an inorganic insulating material and may include a contact hole through which the second touch conductive layer 220 and the first touch conductive layer 210 may be connected to each other.

In various embodiments, the second insulating layer 230 may be disposed on the first insulating layer 215 and the second touch conductive layer 220. The second insulating layer 230 may cover the first touch conductive layer 210, the first insulating layer 215, and the second touch conductive layer 220 disposed therebelow, and may serve to planarize an upper portion of the first insulating layer 215. The second insulating layer 230 may include an organic insulating material.

Referring to FIG. 6 again, a light blocking member BM may be disposed on the touch sensing layer TSL. The light blocking member BM may be made of a light blocking material. The light blocking member BM may block the lights emitted from the first light emitting portion EMA1, the second light emitting portion EMA2, and the third light emitting portion EMA3, so that these lights are not mixed with each other. The light blocking member BM may be disposed to overlap the non-emission area NEA and not to overlap the first light emitting portion EMA1, the second light emitting portion EMA2, and the third light emitting portion EMA3. In some embodiments, the light blocking member BM may be disposed in the same shape as the non-emission area NEA in plan view. The light blocking member BM may include a dye or a pigment representing black, and may include, for example, carbon black.

A color filter layer CF may be disposed on the light blocking member BM and the second insulating layer 230. The color filter layer CF may include a first color filter CF1, a second color filter CF2, and a third color filter CF3.

The first color filter CF1 may be disposed to overlap the first light emitting portion EMA1, the second color filter CF2 may be disposed to overlap the second light emitting portion EMA2, and the third color filter CF3 may be disposed to overlap the third light emitting portion EMA3, where the color filters CF1, CF2, CF3 may be vertically aligned with the light emitting portions EMA. The first color filter CF1 may selectively transmit the red light therethrough and block or absorb the green light and the blue light. The first color filter CF1 may be a red color filter and may include a red colorant such as a red dye or a red pigment. The second color filter CF2 may selectively transmit the green light therethrough and block or absorb the blue light and the red light. The second color filter CF2 may be a green color filter and may include a green colorant such as a green dye or a green pigment. The third color filter CF3 may selectively transmit the blue light therethrough and block or absorb the green light and the red light. The third color filter CF3 may be a blue color filter and may include a blue colorant such as a blue dye or a blue pigment.

The above-described color filter layer CF may be disposed not to overlap the light sensing portion RA. The light sensing portion RA can be an area on which the red light emitted from the first light emitting element EL1 is reflected from the user's body and is incident, and the color filter layer CF may not be disposed in the light sensing portion RA. On the other hand, in some embodiments, the red color filter, such as the first color filter CF1 may be disposed in the light sensing portion RA.

In various embodiments, the color filter layer CF and the light blocking member BM may be covered by an overcoating layer OC. The overcoating layer OC may be made of a material having excellent light transmissivity. The overcoating layer OC may planarize upper portions of the color filter layer CF and the light blocking member BM. The overcoating layer OC may be made of an acrylic epoxy material, but is not limited thereto.

In various embodiments, a window WDL may be disposed on the overcoating layer OC. The window WDL may be a protective member disposed on the overcoating layer OC to protect components of the display device 1. The window WDL may be made of glass or plastic. When the window WDL is made of glass, the window may be made of ultra-thin glass (UTG) having a thickness of about 0.1 mm or less in order to have flexible properties. In addition, a polarizing plate may be disposed and a transparent adhesive member may be disposed, between the window WDL and the overcoating layer OC.

Referring to FIG. 9, the display device 1 according to an embodiment may measure a fingerprint and blood pressure when the user's body, for example, a finger, comes into contact with the display device 1.

In the case of a fingerprint, the red light emitted from the first light emitting element EL1 may be reflected from a ridge and a valley of a user's fingerprint. In this case, a refractive index of the fingerprint and a refractive index of air are different from each other, and thus, an amount of light reflected from the ridge of the fingerprint and an amount of light reflected from the valley of the fingerprint may be different from each other. Accordingly, a ridge portion and a valley portion of the fingerprint may be determined based on a difference between the amounts of reflected light, that is incident on the light sensing portion RA. Because the photoelectric conversion device PD outputs an electrical signal (or a photocurrent) according to the difference between the amounts of light, a fingerprint pattern of the finger may be identified.

In the case of blood pressure, the red light emitted from the first light emitting element EL1 may be reflected from a blood vessel of a user's dermal layer. The red light has a long wavelength and may penetrate deeply, for example, into the user's finger. In this case, by using the principle that the red light is reflected from blood in the blood vessel, a pulse rate may be measured based on a difference between an increase in amount of the reflected light due to an increase in blood flow when the heart beats and a decrease in amount of the reflected light due to a decrease in blood flow. The user's blood pressure may be calculated and measured based on such a pulse rate.

According to an embodiment, the user's fingerprint and blood pressure may be measured by detecting an amount of photocurrent in the photoelectric conversion device PD when the red light emitted from the first light emitting element EL1 is reflected from the user's finger. The fingerprint may be positioned on a surface of the user's finger and thus be identified by making an intensity of the light emitted from the first light emitting element EL1 relatively small and driving the display device for a short light detection time. On the other hand, the blood vessel may be positioned inside the user's finger and thus, the blood pressure may be measured by making an intensity of the light emitted from the first light emitting element EL1 relatively large and driving the display device for a long light detection time. However, the present disclosure is not limited thereto.

As described above, in the display device 1 according to an embodiment, the first resonance layer OAL1 of the first light emitting element EL1 and the fourth resonance layer OAL4 of the photoelectric conversion device PD are formed to have the same thickness, such that efficiency of the red light of the first light emitting element EL1 may be improved and efficiency of the red light incident on the photoelectric conversion device PD may be improved to further improve light sensing characteristics.

In addition, by including the compounds represented by Formulas 1 and 2 in the active layer ACL of the photoelectric conversion device PD, an absorption ratio of the red light of the photoelectric conversion device PD may be increased to improve light sensing characteristics.

In addition, by measuring the user's blood pressure and fingerprint using the red light of the first light emitting element EL1, there is an advantage that various biometric information may be extracted using one display device 1.

Performance evaluation of the photoelectric conversion device may be confirmed by measuring external quantum efficiency and dark current density.

Hereinafter, performance of the above-described photoelectric conversion device will be described in more detail through Experimental Example.

EXPERIMENTAL EXAMPLE

Comparative Example 1

In a non-limiting exemplary embodiment, an ITO glass substrate was cut in a size of 50 mm×50 mm×0.5 mm, ultrasonically cleaned using isopropyl alcohol and pure water for 10 minutes, irradiated with ultraviolet rays for 10 minutes, and then exposed to ozone to be cleaned. HAT-CN (see below) was deposited on the ITO glass substrate to form a hole injection layer, and HT3 (see below) was deposited on the hole injection layer to form a hole transport layer. HT3 was deposited on the hole transport layer to form a vacuum layer, a D12 compound was stacked at a thickness of 225 Å on the vacuum layer to form a donor layer, and an A01 compound was stacked at a thickness of 360 Å to form an acceptor layer, such that an active layer was formed. Thereafter, BAlq (see below) was deposited to form a buffer layer, and ET1 (see below) was deposited on the buffer layer to form an electron transport layer. Lithium quinolate (Liq) was deposited on the electron transport layer to form an electron injection layer, and MgAg was deposited on the electron injection layer to form a second electrode, such that a photoelectric conversion device was manufactured. In this case,

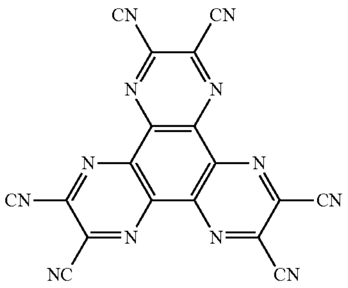

HAT-CN

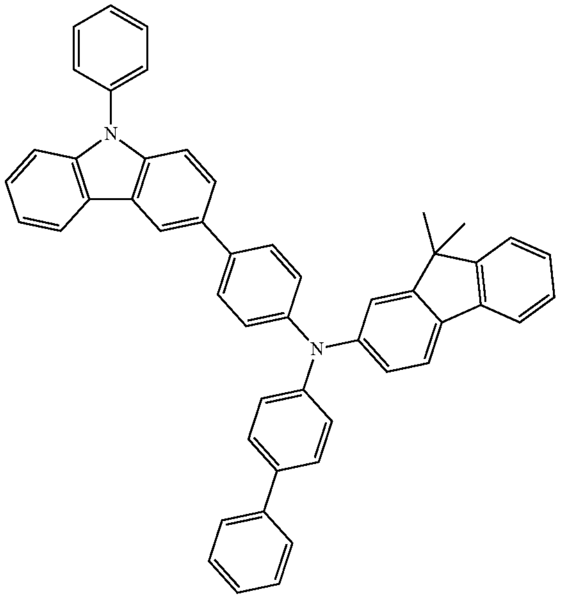

HT3

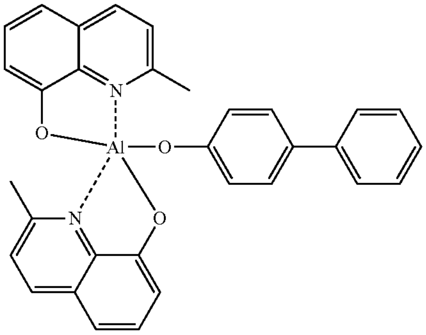

BAlq

-continued

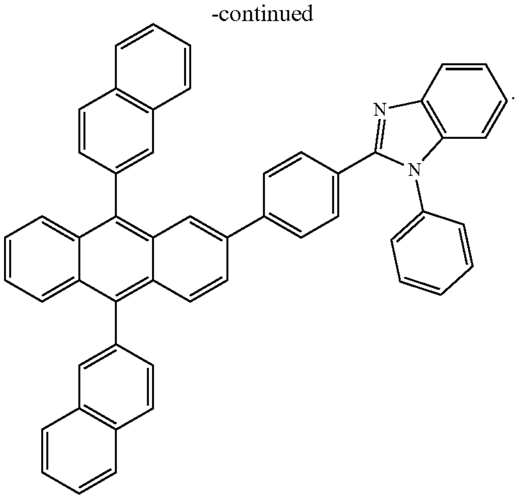

ET1

Comparative Example 2

A photoelectric conversion device was manufactured under the same conditions as those of Comparative Example 1 except that the acceptor layer was formed at a thickness of 405 Å.

Comparative Example 3

A photoelectric conversion device was manufactured under the same conditions as those of Comparative Example 1 except that the acceptor layer was formed at a thickness of 450 Å.

Example 1

A photoelectric conversion device was manufactured under the same conditions as those of Comparative Example 1 except that the donor layer was formed at a thickness of 180 Å.

Example 2

A photoelectric conversion device was manufactured under the same conditions as those of Comparative Example 1 except that the donor layer was formed at a thickness of 180 Å and the acceptor layer was formed at a thickness of 405 Å.

Example 3

A photoelectric conversion device was manufactured under the same conditions as those of Comparative Example 1 except that the donor layer was formed at a thickness of 180 Å and the acceptor layer was formed at a thickness of 450 Å.

For the photoelectric conversion devices manufactured in Comparative Examples 1 to 3 and Examples 1 to 3, external quantum efficiency (EQE) for a wavelength of 630 nm and dark current density at a −3V reverse bias were measured by applying voltages to first electrodes and measuring currents in a dark room, and measurement results were shown in Table 1.

TABLE 1

| | External Quantum Efficiency (%) @630 nm | Dark Current Density ($mA/cm^2$) |
|---|---|---|
| Comparative Example 1 | 28.8 | 1.3E−07 |
| Comparative Example 2 | 28.9 | 3.0E−07 |
| Comparative Example 3 | 29.8 | 4.0E−07 |
| Example 1 | 32.0 | 2.5E−06 |
| Example 2 | 35.8 | 2.4E−07 |
| Example 3 | 37.7 | 2.2E−07 |

Referring to Table 1, it may be confirmed that the photoelectric conversion devices according to Examples 1 to 3 exhibit external quantum efficiencies improved as compared with the photoelectric conversion devices according to Comparative Examples 1 to 3 while exhibiting dark current densities equivalent to those of the photoelectric conversion devices according to Comparative Examples 1 to 3.

As described above, the photoelectric conversion device and the display device comprising the same according to an embodiment may improve sensing characteristics of the red light by including the donor layer including the compound represented by Formula 1 and the acceptor layer including the compound represented by Formula 2.

In addition, because the first light emitting element from which the red light is emitted and the photoelectric conversion device on which the red light is incident and sensed have the same resonance distance, efficiency of the red light may be increased to improve luminous efficiency and light sensing efficiency.

In addition, various biometric information such as the user's fingerprint and blood pressure may be extracted using, for example, the red light.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. A display device comprising:

a plurality of light emitting portions, wherein the plurality of light emitting portions include a plurality of light emitting elements; and a sensing portion including a photoelectric conversion device in the sensing portion, wherein the photoelectric conversion device includes a first electrode, a common electrode facing the first electrode, and a hole injection layer, a hole transport layer, a resonance layer having a thickness, and an active layer sequentially stacked between the first electrode and the common electrode, and wherein the plurality of light emitting elements include, a pixel electrode, the common electrode facing the pixel electrode, and the hole injection layer, the hole transport layer, the resonance layer, and a light emitting layer sequentially stacked between the pixel electrode and the common electrode, wherein a thickness of each of the resonance layers of light emitting elements configured to emit light of different colors are different from each other, and a thickness of the resonance layer of at least one of the light emitting elements is the same as a thickness of the resonance layer of the photoelectric conversion device.

2. The display device of claim 1, wherein the plurality of light emitting elements include a first light emitting element configured to emit red light, a second light emitting element configured to emit green light, and a third light emitting element configured to emit blue light, and the resonance layer includes a first resonance layer having a first thickness disposed in the first light emitting element, a second resonance layer having a second thickness disposed in the second light emitting element, a third resonance layer having a third thickness disposed in the third light emitting element, and a fourth resonance layer having a fourth thickness disposed in the photoelectric conversion device.

3. The display device of claim 2, wherein the first thickness is the same as the fourth thickness.

4. The display device of claim 2, wherein the first thickness is greater than the second thickness and the third thickness.

5. The display device of claim 2, wherein a distance from an upper surface of the pixel electrode of the first light emitting element to a lower surface of the light emitting layer is the same as a distance from an upper surface of the first electrode of the photoelectric conversion device to a lower surface of the active layer.

6. The display device of claim 1, wherein the plurality of light emitting elements further include buffer layers, electron transport layers, and electron injection layers sequentially stacked on the light emitting layers, and the photoelectric conversion device further includes the buffer layer, the electron transport layer, and the electron injection layer sequentially stacked on the active layer.

7. The display device of claim 1, wherein the active layer includes a donor layer and an acceptor layer disposed on the donor layer, and the donor layer is disposed on the resonance layer.

8. The display device of claim 7, wherein the donor layer has a thickness of about 100 to about 200 Å.

9. The display device of claim 7, wherein the acceptor layer has a thickness of about 300 to about 500 Å.

* * * * *